United States Patent
Bondokov et al.

(10) Patent No.: US 10,851,474 B2
(45) Date of Patent: *Dec. 1, 2020

(54) THERMAL CONTROL FOR FORMATION AND PROCESSING OF ALUMINUM NITRIDE

(71) Applicants: Robert T. Bondokov, Watervliet, NY (US); Jianfeng Chen, Ballston Lake, NY (US); Keisuke Yamaoka, Green Island (JP); Shichao Wang, Troy, NY (US); Shailaja P. Rao, Cohoes, NY (US); Takashi Suzuki, Troy, NY (US); Leo J. Schowalter, Latham, NY (US)

(72) Inventors: Robert T. Bondokov, Watervliet, NY (US); Jianfeng Chen, Ballston Lake, NY (US); Keisuke Yamaoka, Green Island (JP); Shichao Wang, Troy, NY (US); Shailaja P. Rao, Cohoes, NY (US); Takashi Suzuki, Troy, NY (US); Leo J. Schowalter, Latham, NY (US)

(73) Assignee: CRYSTAL IS, INC., Green Island, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/714,939

(22) Filed: Dec. 16, 2019

(65) Prior Publication Data

US 2020/0190694 A1 Jun. 18, 2020

Related U.S. Application Data

(63) Continuation of application No. 16/185,832, filed on Nov. 9, 2018, now Pat. No. 10,550,493.

(Continued)

(51) Int. Cl.
*H01L 21/00* (2006.01)
*C30B 29/40* (2006.01)
(Continued)

(52) U.S. Cl.
CPC .......... *C30B 29/403* (2013.01); *C30B 23/002* (2013.01); *C30B 23/066* (2013.01);
(Continued)

(58) Field of Classification Search
CPC ... C30B 29/403; C30B 23/002; C30B 23/066; H01L 33/0075; H01L 21/02389; H01S 5/0217; H01S 5/3013; H01S 5/34333
See application file for complete search history.

(56) References Cited

U.S. PATENT DOCUMENTS 5,834,331 A * 11/1998 Razeghi ............... B82Y 20/00
                                                       438/40
7,638,346 B2 12/2009 Schowalter et al.
(Continued)

FOREIGN PATENT DOCUMENTS

KR     10-1146050 B1     5/2012

OTHER PUBLICATIONS

International Search Report and the Written Opinion for international application No. PCT/US2018/060064 dated Mar. 8, 2019 15 pages.

*Primary Examiner* — Richard A Booth
(74) *Attorney, Agent, or Firm* — Morgan, Lewis & Bockius LLP

(57) ABSTRACT

In various embodiments, controlled heating and/or cooling conditions are utilized during the fabrication of aluminum nitride single crystals and aluminum nitride bulk polycrystalline ceramics. Thermal treatments may also be utilized to control properties of aluminum nitride crystals after fabrication.

24 Claims, 17 Drawing Sheets

Related U.S. Application Data

(60) Provisional application No. 62/584,214, filed on Nov. 10, 2017.

(51) Int. Cl.
  C30B 23/06 (2006.01)
  H01L 33/00 (2010.01)
  C30B 23/00 (2006.01)
  H01S 5/30 (2006.01)
  H01S 5/343 (2006.01)
  H01S 5/02 (2006.01)
  H01L 21/02 (2006.01)

(52) U.S. Cl.
  CPC .... H01L 33/0075 (2013.01); *H01L 21/02389* (2013.01); *H01S 5/0217* (2013.01); *H01S 5/3013* (2013.01); *H01S 5/34333* (2013.01)

(56) References Cited

U.S. PATENT DOCUMENTS

| | | |
|---|---|---|
| 9,028,612 B2 | 5/2015 | Bondokov et al. |
| 9,447,519 B2 | 9/2016 | Schujman et al. |
| 2007/0101932 A1* | 5/2007 | Schowalter ............. H01L 33/12 117/84 |
| 2007/0257333 A1 | 11/2007 | Schlesser et al. |
| 2012/0000414 A1 | 1/2012 | Bondokov et al. |
| 2014/0331918 A1 | 11/2014 | Pogorelsky et al. |
| 2018/0204722 A1* | 7/2018 | Miyake ................. H01L 21/324 |
| 2018/0363164 A1 | 12/2018 | Schowalter et al. |
| 2019/0145020 A1 | 5/2019 | Bondokov |

* cited by examiner

| SAMPLE ID | AVG CONC BELOW 1 μm (x10$^{17}$ atom/cc) | | | C/O RATIO | UV ABS (APROX) |
|---|---|---|---|---|---|
| | Si | O | C | | |
| (1) | 1.1 | 9.4 | 11.2 | 1.2 | 2000 |
| (2) (MEASUREMENT 1) | 0.9 | 9.3 | 10.1 | 1.1 | 2000 |
| (2) (MEASUREMENT 2) | 0.9 | 9.6 | 8.2 | 0.9 | 135.1 |
| (3) | 0.9 | 8.8 | 2.8 | 0.3 | 41.9 |
| (4) | 0.9 | 7.7 | 3.2 | 0.4 | 39.5 |

FIG. 5B

UV, cm-1 = 26.658951 + 14.897762*Carbon, xE + 17

UV, cm-1 = 15.836045 + 95.153993*RATIO <C/O>

THERMAL CONTROL FOR FORMATION AND PROCESSING OF ALUMINUM NITRIDE

RELATED APPLICATIONS

This application is a continuation of U.S. patent application Ser. No. 16/185,832, filed Nov. 9, 2018, which claims the benefit of and priority to U.S. Provisional Patent Application No. 62/584,214, filed Nov. 10, 2017, the entire disclosure of each of which is hereby incorporated herein by reference.

This application claims the benefit of and priority to U.S. Provisional Patent Application No. 62/584,214, filed Nov. 10, 2017, the entire disclosure of which is hereby incorporated herein by reference.

TECHNICAL FIELD

In various embodiments, the present invention relates to the fabrication of single-crystal aluminum nitride (AlN).

BACKGROUND

Aluminum nitride (AlN) holds great promise as a semiconductor material for numerous applications, e.g., optoelectronic devices such as short-wavelength light-emitting diodes (LEDs) and lasers, dielectric layers in optical storage media, electronic substrates, and chip carriers where high thermal conductivity is essential, among many others. In principle, the properties of AlN may allow light emission at wavelengths down to around 200 nanometers (nm) to be achieved. Recent work has demonstrated that ultraviolet (UV) LEDs have superior performance when fabricated on low-defect AlN substrates prepared from bulk AlN single crystals. The use of AlN substrates is also expected to improve high-power radio-frequency (RF) devices made with nitride semiconductors due to the high thermal conductivity with low electrical conductivity. However, the commercial feasibility of AlN-based semiconductor devices is limited by the scarcity and high cost of large, low-defect single crystals of AlN.

To make large-diameter AlN substrates more readily available and cost-effective, and to make the devices built thereon commercially feasible, it is desirable to grow large-diameter (>25 mm) AlN bulk crystals at a high growth rate (>0.5 mm/hr) while preserving crystal quality. The most effective method of growing AlN bulk single crystals is the "sublimation-recondensation" method that involves sublimation of lower-quality (typically polycrystalline) AlN source material and recondensation of the resulting vapor to form the single-crystal AlN. U.S. Pat. No. 6,770,135 (the '135 patent), U.S. Pat. No. 7,638,346 (the '346 patent), U.S. Pat. No. 7,776,153 (the '153 patent), and U.S. Pat. No. 9,028,612 (the '612 patent), the entire disclosures of which are incorporated by reference herein, describe various aspects of sublimation-recondensation growth of AlN, both seeded and unseeded.

While AlN substrates are enabling platforms for the fabrication of UV light-emitting devices such as LEDs, their performance in such applications is often limited by their transparency to UV light (i.e., "UV transparency") or lack thereof. AlN substrates with high UV transparency are often difficult to produce, as UV transparency is compromised by contamination and/or point defects introduced during the AlN growth process. Such issues have been addressed on a limited basis via techniques disclosed in U.S. Pat. Nos. 8,012,257, 9,034,103, and 9,447,519, the entire disclosure of each of which is incorporated herein by reference. Specifically, these patents disclose techniques for controlling the introduction of oxygen impurities during polycrystalline AlN source-material preparation and sublimation-recondensation growth of single-crystal AlN. While such techniques were reported as enabling production of bulk AlN crystals having low absorption coefficients, and thus high UV transparency, it has been found by the present inventors that such techniques are incapable of producing high UV transparency when utilized in conjunction with seeded growth of AlN bulk crystals exceeding 25 mm in diameter (e.g., crystals between 30 mm and 75 mm in diameter, for example approximately 50 mm in diameter) at high growth rates (e.g., at least 0.5-0.8 mm/hr) and utilizing the large axial and radial thermal gradients necessary for such growth.

For example, FIG. 6 of U.S. Pat. No. 9,447,519 (the '519 patent) depicts an absorption spectrum of an AlN crystal produced utilizing the oxygen-control techniques and controlled post-growth cooling described in the '519 patent. As the figure indicates, that AlN crystal had an absorption coefficient below about 10 $cm^{-1}$ for the wavelength range between 300 nm and 350 nm. However, that crystal was produced utilizing unseeded growth and had a maximum diameter of less than 25 mm. The present inventors attempted to reproduce this high UV transparency utilizing the same techniques for an otherwise substantially identical growth process involving seeded growth of a crystal of approximately 50 mm in diameter. Unfortunately, even utilizing the techniques of the '519 patent, the resulting crystals were effectively opaque, i.e., exhibiting an absorption coefficient greater than 100-200 $cm^{-1}$ over one or more UV wavelengths, and/or exhibiting large peaks in the absorption coefficient at approximately 265 nm and/or 310 nm. An example graph of the absorption coefficients of different wafers sliced from a boule produced using the techniques of the '519 patent and having a diameter of 50 mm is shown in FIG. 1A. As shown, each of the wafers from this boule is essentially opaque at various UV wavelengths. The UV transparency of similar crystals was particularly poor for crystals produced utilizing an on-axis AlN seed. On-axis growth is preferred for economic reasons; off-axis boules of AlN must be cut at an angle to produce on-axis substrates therefrom, and thus the number of substrates that may be produced from an off-axis boule is necessarily less than that which may be produced from an on-axis boule. In view of these results, the present inventors recognized a need for novel and improved techniques of achieving high levels of UV transparency in larger AlN bulk crystals.

SUMMARY

In various embodiments of the present invention, growth of large, high-quality, highly UV-transparent single crystals of AlN is enabled via techniques that limit the introduction of contaminants and defects that compromise UV transparency. Such techniques are particularly beneficial for the fabrication of AlN bulk crystals having diameters greater than 25 mm (e.g., approximately 50 mm or greater) utilizing seeded growth procedures at high growth rates (e.g., growth rates of at least 0.5 mm/hr)—a substrate-fabrication regime in which high levels of UV transparency and substrate quality are not achievable utilizing conventional techniques. Embodiments of the invention also enable the growth of large single crystals of AlN that possess both high levels of UV transparency and high levels of crystalline quality (e.g., low densities of crystalline defects such as dislocations), even at crystal diameters greater than 25 mm or of approximately 50 mm or greater.

The present inventors have discovered that the presence of carbon impurities can lead to high levels of UV absorption in AlN bulk crystals. Carbon incorporation leads to UV absorption at wavelengths around 265 nm, which can hinder the performance of UV light-emitting devices. (In the '519 patent, control of carbon incorporation was not explicitly contemplated, as carbon was suggested as both a possible dopant and crucible material for AlN fabrication.) In contrast, oxygen impurities (or related point defects) typically result in UV absorption at wavelengths around 310 nm. Thus, while control of oxygen contamination is desirable for UV transparency, it is not sufficient to enable UV transparency at many UV wavelengths. Embodiments of the present invention include techniques for the control and limitation of both carbon and oxygen contamination during an AlN growth procedure via a physical vapor transport technique such as sublimation-recondensation. Such techniques include reduction or substantial elimination of carbon and oxygen impurities from the polycrystalline AlN source material, control of various growth parameters (e.g., growth pressure) during fabrication, and active control of the cooldown of the grown AlN crystal from the elevated growth temperature to reduce contamination while also avoiding cracking of the material.

In various embodiments of the present invention, the radial and/or axial thermal gradients within the crystal-growth crucible utilized to promote and control the growth of the AlN material may be controlled in various different manners. For example, individual heating elements arranged around the crucible may be powered to different levels (and thus different temperatures) to establish thermal gradients within the crucible. In addition or instead, thermal insulation may be selectively arranged around the crucible such that thinner and/or less insulating insulation is positioned around areas of higher desired temperature. As detailed in the '612 patent, thermal shields may also be arranged around the crucible, e.g., above and/or below the crucible, in any of a multitude of different arrangements in order to establish desired thermal gradients within the crucible.

Although embodiments of the invention have been presented herein utilizing AlN as the exemplary crystalline material fabricated in accordance therewith, embodiments of the invention may also be applied to other crystalline materials such as silicon carbide (SiC) and zinc oxide (ZnO); thus, herein, all references to AlN herein may be replaced, in other embodiments, by SiC or ZnO. As utilized herein, the term "diameter" refers to a lateral dimension (e.g., the largest lateral dimension) of a crystal, growth chamber, or other object, even if the crystal, growth chamber, or other object is not circular and/or is irregular in cross-section.

As utilized herein, a "substrate" or a "wafer" is a portion of a previously grown crystalline boule having top and bottom opposed, generally parallel surfaces. Substrates typically have thicknesses ranging between 200 μm and 1 mm and may be utilized as platforms for the epitaxial growth of semiconductor layers and the fabrication of semiconductor devices (e.g., light-emitting devices such as lasers and light-emitting diodes, transistors, power devices, etc.) thereon. As utilized herein, "room temperature" is 25° C.

In an aspect, embodiments of the invention feature a method of forming single-crystal aluminum nitride (AlN). A bulk polycrystalline AlN ceramic is provided. At least a portion of the AlN ceramic is disposed into a first crucible. The at least a portion of the AlN ceramic is annealed and densified in the first crucible, thereby forming a polycrystalline AlN source. The annealing and densifying includes, consists essentially of, or consists of (i) heating the at least a portion of the AlN ceramic at a first temperature ranging from 1100° C. to 1900° C. for a first time ranging from 2 hours to 25 hours, and (ii) thereafter, heating the at least a portion of the AlN ceramic at a second temperature ranging from 1900° C. to 2250° C. for a second time ranging from 3 hours to 15 hours, or (i) heating the at least a portion of the AlN ceramic during a temperature ramp to a third temperature ranging from 1900° C. to 2250° C. over a third time ranging from 5 hours to 25 hours, and (ii) thereafter, heating the at least a portion of the AlN ceramic at a fourth temperature ranging from 1900° C. to 2250° C. for a fourth time ranging from 3 hours to 25 hours. The AlN source is cooled to approximately room temperature. A second crucible is disposed within a furnace. The second crucible contains the AlN source and a seed crystal that includes, consists essentially of, or consists of single-crystal AlN. The second crucible is heated with the furnace to a growth temperature of at least 2000° C. The second crucible is maintained at the growth temperature for a soak time ranging from 1 hour to 10 hours. After the soak time, while the second crucible is at the growth temperature, (i) vapor including, consisting essentially of, or consisting of aluminum and nitrogen is condensed on the seed crystal, thereby forming a single-crystalline AlN boule extending from the seed crystal, and (ii) the second crucible is moved relative to the furnace. The growth rate of at least a portion of the AlN boule is approximately equal to a rate of relative motion between the second crucible and the furnace. Thereafter, the AlN boule is cooled via a cooling cycle. The cooling cycle includes, consists essentially of, or consists of (i) cooling the AlN boule from the growth temperature to a fifth temperature ranging from 1450° C. to 2150° C. over a fifth time ranging from 10 minutes to 90 minutes, and (ii) thereafter, cooling the AlN boule from the fifth temperature to a sixth temperature ranging from 1000° C. to 1650° C. over a sixth time ranging from 10 seconds to 10 minutes, or (i) cooling the AlN boule from the growth temperature to a seventh temperature ranging from 1450° C. to 2150° C. over a seventh time ranging from 10 seconds to 10 minutes, and (ii) thereafter, cooling the AlN boule from the seventh temperature to an eighth temperature ranging from 1000° C. to 1650° C. over an eighth time ranging from 10 minutes to 90 minutes. Thereafter, the AlN boule is cooled to approximately room temperature.

Embodiments of the invention may include one or more of the following in any of a variety of combinations. The growth temperature may be approximately 2300° C. or less, approximately 2200° C. or less, or approximately 2100° C. or less. The diameter of at least a portion (or even all) of the AlN boule may be at least approximately 35 mm, at least approximately 50 mm, at least approximately 75 mm, or at least approximately 100 mm. The diameter of at least a portion (or even all) of the AlN boule may be at most approximately 150 mm, at most approximately 125 mm, at most approximately 100 mm, or at most approximately 75 mm. The diameter of at least a portion (or even all) of the AlN boule may be approximately 50 mm. Oxygen (e.g., oxygen gas or an oxygen-containing gas) may be introduced into the second crucible during formation of the single-crystalline AlN boule extending from the seed crystal. Prior to disposing the at least a portion of the AlN ceramic into the first crucible, the AlN ceramic may be fragmented into fragments. One or more (or even each) of the fragments may have a width (or diameter, or length, or other dimension) greater than approximately 0.1 cm, greater than approximately 0.2 cm, greater than approximately 0.3 cm, greater than approximately 0.4 cm, greater than approximately 0.5 cm, greater than approximately 0.7 cm, or greater than approximately 1 cm. One or more (or even each) of the fragments may have a width (or diameter, or length, or other dimension) less than approximately 5 cm, less than approximately 4 cm, less than approximately 3 cm, less than approximately 2 cm, less than approximately 1.5 cm, or less than approximately 1 cm. The at least a portion of the AlN ceramic may include, consist essentially of, or consist of one or more of the fragments.

A crystalline orientation of the seed crystal may be substantially parallel to a c-axis. The first crucible and the second crucible may be the same crucible or different crucibles. The growth rate may be at least 0.1 mm/hour, at least 0.2 mm/hour, at least 0.3 mm/hour, at least 0.4 mm/hour, at least 0.5 mm/hour, at least 0.7 mm/hour, or at least 1 mm/hour. The growth rate may be at most 3 mm/hour, at most 2.5 mm/hour, at most 2 mm/hour, at most 1.5 mm/hour, or at most 1 mm/hour. The soak time may be at least approximately 2 hours, at least approximately 3 hours, at least approximately 4 hours, at least approximately 5 hours, or at least approximately 6 hours. The soak time may be at most approximately 9 hours, at most approximately 8 hours, at most approximately 7 hours, at most approximately 6 hours, or at most approximately 5 hours. The soak time may be approximately 5 hours. The diameter of the seed crystal may be approximately 25 mm or larger, approximately 30 mm or larger, approximately 35 mm or larger, approximately 40 mm or larger, approximately 45 mm or larger, or approximately 50 mm or larger. The diameter of the seed crystal may be approximately 150 mm or smaller, approximately 100 mm or smaller, approximately 75 mm or smaller, or approximately 50 mm or smaller.

The AlN boule may be sliced to form a single-crystalline AlN substrate having a diameter of at least 25 mm, at least 30 mm, at least 35 mm, at least 40 mm, at least 45 mm, or at least 50 mm. The diameter of the single-crystalline AlN substrate may be approximately 150 mm or smaller, approximately 100 mm or smaller, approximately 75 mm or smaller, or approximately 50 mm or smaller. The diameter of the single-crystalline AlN substrate may be approximately 50 mm. A light-emitting device may be fabricated over at least a portion of the AlN substrate. The light-emitting device may be configured to emit ultraviolet light. After forming at least a portion of the light-emitting device (e.g., all or a portion of an epitaxial light-emitting layer structure), at least a portion (or even all) of the AlN substrate may be removed from the light-emitting device. The light-emitting device may include, consist essentially of, or consist of a light-emitting diode and/or a laser.

Oxygen and/or carbon may be gettered during formation of the single-crystalline AlN boule. The oxygen and/or carbon may be gettered with a gettering material introduced into the second crucible and/or the furnace prior to and/or during formation of the single-crystalline AlN boule. The gettering material may have a melting point greater than the growth temperature and/or a eutectic melting point with AlN greater than the growth temperature. The gettering material may include, consist essentially of, or consist of boron, iridium, niobium, molybdenum, tantalum, tungsten, and/or rhenium. The bulk polycrystalline AlN ceramic may have less than approximately 1% excess Al and/or an oxygen concentration less than $2\times10^{19}$ cm$^{-3}$. Embodiments of the invention may include AlN boules and/or substrates formed in accordance with any of the above methods.

In another aspect, embodiments of the invention feature a single-crystal AlN substrate having (i) a diameter of at least approximately 50 mm and (ii) an ultraviolet (UV) transparency metric ranging from approximately 5 cm$^3$ to approximately 5000 cm$^3$ at a wavelength of interest of 265 nm. The UV transparency metric is defined in cm$^3$ as $$\frac{d}{10 \times FWHM \times \alpha^2},$$

where d is a diameter of the AlN substrate in mm, FWHM is a full-width at half-maximum of an x-ray diffraction curve of the AlN substrate in radians, and α is an absorption coefficient of the AlN substrate at the wavelength of interest.

Embodiments of the invention may include one or more of the following in any of a variety of combinations. The diameter of the AlN substrate may be approximately 50 mm. The diameter of the AlN substrate may be at least approximately 60 mm, at least approximately 65 mm, at least approximately 70 mm, at least approximately 75 mm, at least approximately 80 mm, at least approximately 85 mm, at least approximately 90 mm, at least approximately 95 mm, or at least approximately 100 mm. The diameter of the AlN substrate may be no greater than approximately 150 mm, no greater than approximately 125 mm, no greater than approximately 110 mm, or no greater than approximately 100 mm. The thermal conductivity of the AlN substrate may be, at room temperature, approximately 250 W/m·K or greater, approximately 270 W/m·K or greater, approximately 290 W/m·K or greater, approximately 300 W/m·K or greater, or approximately 320 W/m·K or greater. The thermal conductivity of the AlN substrate may be, at room temperature, approximately 400 W/m·K or less, approximately 350 W/m·K or less, or approximately 300 W/m·K or less. A crystalline orientation of the AlN substrate may be substantially parallel to a c-axis. A crystalline orientation of the AlN substrate may be angled at least approximately 10° relative to a c-axis, at least approximately 12° relative to a c-axis, at least approximately 15° relative to a c-axis, or at least approximately 20° relative to a c-axis. A crystalline orientation of the AlN substrate may be angled at most approximately 30° relative to a c-axis, at most approximately 25° relative to a c-axis, at most approximately 20° relative to a c-axis, or at most approximately 15° relative to a c-axis.

A light-emitting device may be disposed over the AlN substrate. The light-emitting device may be configured to emit ultraviolet light. The light-emitting device may include, consist essentially of, or consist of a light-emitting diode and/or a laser. A density of threading edge dislocations in the AlN substrate may be less than $5\times10^5$ cm$^{-2}$, less than $1\times10^5$ cm$^{-2}$, less than $5\times10^4$ cm$^{-2}$, less than $1\times10^4$ cm$^{-2}$, less than $5\times10^3$ cm$^{-2}$, or less than $1\times10^3$ cm$^{-2}$. A density of threading edge dislocations in the AlN substrate may be more than 10 cm$^{-2}$, more than 100 cm$^{-2}$, more than 500 cm$^{-2}$, or more than 1000 cm$^{-2}$. A density of threading screw dislocations in the AlN substrate may be less than 100 cm$^{-2}$, less than 50 cm$^{-2}$, less than 10 cm$^{-2}$, less than 5 cm$^{-2}$, or less than 1 cm$^{-2}$. A density of threading screw dislocations in the AlN substrate may be more than 0.1 cm$^{-2}$, more than 0.5 cm$^{-2}$, more than 1 cm$^{-2}$, more than 2 cm$^{-2}$, or more than 5 cm'.

A silicon concentration of the AlN substrate may be less than $1\times10^{19}$ cm$^{-3}$, less than $5\times10^{18}$ cm$^{-3}$, less than $1\times10^{18}$ $cm^{-3}$, less than $5×10^{17}$ $cm^{-3}$, less than $3×10^{17}$ $cm^{-3}$, less than $1×10^{17}$ $cm^{-3}$, less than $5×10^{16}$ $cm^{-3}$, or less than $1×10^{16}$ $cm^{-3}$. A silicon concentration of the AlN substrate may be more than $1×10^{14}$ $cm^{-3}$, more than $5×10^{14}$ $cm^{-3}$, more than $1×10^{15}$ $cm^{-2}$, more than $5×10^{15}$ $cm^{-3}$, more than $1×10^{16}$ $cm^{-3}$, more than $5×10^{16}$ $cm^{-3}$, or more than $1×10^{17}$ $cm^{-3}$. An oxygen concentration of the AlN substrate may be less than $1×10^{19}$ $cm^{-3}$, less than $5×10^{18}$ $cm^{-3}$, less than $1×10^{18}$ $cm^{-3}$, less than $5×10^{17}$ $cm^{-3}$, less than $3×10^{17}$ $cm^{-3}$, less than $1×10^{17}$ $cm^{-3}$, less than $5×10^{16}$ $cm^{-3}$, more or less than $1×10^{16}$ $cm^{-3}$. An oxygen concentration of the AlN substrate may be more than $1×10^{14}$ $cm^{-3}$, more than $5×10^{14}$ $cm^{-3}$, more than $1×10^{15}$ $cm^{-3}$, more than $5×10^{15}$ $cm^{-3}$, more than $1×10^{16}$ $cm^{-3}$, more than $5×10^{16}$ $cm^{-3}$, or more than $1×10^{17}$ $cm^{-3}$. A carbon concentration of the AlN substrate may be less than $1×10^{19}$ $cm^{-3}$, less than $5×10^{18}$ $cm^{-3}$, less than $1×10^{18}$ $cm^{-3}$, less than $5×10^{17}$ $cm^{-3}$, less than $3×10^{17}$ $cm^{-3}$, less than $1×10^{17}$ $cm^{-3}$, less than $5×10^{16}$ $cm^{-3}$, or less than $1×10^{16}$ $cm^{-3}$. A carbon concentration of the AlN substrate may be more than $1×10^{14}$ $cm^{-3}$, more than $5×10^{14}$ $cm^{-3}$, more than $1×10^{15}$ $cm^{-3}$, more than $5×10^{15}$ $cm^{-3}$, more than $1×10^{16}$ $cm^{-2}$, more than $5×10^{16}$ $cm^{-3}$, or more than $1×10^{17}$ $cm^{-3}$. The ratio of the carbon concentration of the AlN substrate to the oxygen concentration of the AlN substrate may be less than 1, less than 0.9, less than 0.8, less than 0.7, less than 0.6, less than 0.5, less than 0.4, or less than 0.3. The ratio of the carbon concentration of the AlN substrate to the oxygen concentration of the AlN substrate may be more than 0.1, more than 0.2, more than 0.3, or more than 0.4.

In yet another aspect, embodiments of the invention feature a single-crystal AlN substrate having an ultraviolet (UV) transparency metric ranging from approximately 20 $cm^3$ to approximately 5000 $cm^3$ at a wavelength of interest of 265 nm. The UV transparency metric is defined in $cm^3$ as $$\frac{d}{10 \times FWHM \times \alpha^2},$$

where a is a diameter of the AlN substrate in mm, FWHM is a full-width at half-maximum of an x-ray diffraction curve of the AlN substrate in radians, and a is an absorption coefficient of the AlN substrate at the wavelength of interest.

Embodiments of the invention may include one or more of the following in any of a variety of combinations. The diameter of the AlN substrate may be approximately 50 mm. The diameter of the AlN substrate may be at least approximately 60 mm, at least approximately 65 mm, at least approximately 70 mm, at least approximately 75 mm, at least approximately 80 mm, at least approximately 85 mm, at least approximately 90 mm, at least approximately 95 mm, or at least approximately 100 mm. The diameter of the AlN substrate may be no greater than approximately 150 mm, no greater than approximately 125 mm, no greater than approximately 110 mm, or no greater than approximately 100 mm. The thermal conductivity of the AlN substrate may be, at room temperature, approximately 250 W/m·K or greater, approximately 270 W/m·K or greater, approximately 290 W/m·K or greater, approximately 300 W/m·K or greater, or approximately 320 W/m·K or greater. The thermal conductivity of the AlN substrate may be, at room temperature, approximately 400 W/m·K or less, approximately 350 W/m·K or less, or approximately 300 W/m·K or less. A crystalline orientation of the AlN substrate may be substantially parallel to a c-axis. A crystalline orientation of the AlN substrate may be angled at least approximately 10° relative to a c-axis, at least approximately 12° relative to a c-axis, at least approximately 15° relative to a c-axis, or at least approximately 20° relative to a c-axis. A crystalline orientation of the AlN substrate may be angled at most approximately 30° relative to a c-axis, at most approximately 25° relative to a c-axis, at most approximately 20° relative to a c-axis, or at most approximately 15° relative to a c-axis.

A light-emitting device may be disposed over the AlN substrate. The light-emitting device may be configured to emit ultraviolet light. The light-emitting device may include, consist essentially of, or consist of a light-emitting diode and/or a laser. A density of threading edge dislocations in the AlN substrate may be less than $5×10^5$ $cm^{-2}$, less than $1×10^5$ $cm^{-2}$, less than $5×10^4$ $cm^{-2}$, less than $1×10^4$ $cm^{-2}$, less than $5×10^3$ $cm^{-2}$, or less than $1×10^3$ $cm^{-2}$. A density of threading edge dislocations in the AlN substrate may be more than 10 $cm^{-2}$, more than 100 $cm^{-2}$, more than 500 $cm^{-2}$, or more than 1000 $cm^{-2}$. A density of threading screw dislocations in the AlN substrate may be less than 100 $cm^{-2}$, less than 50 $cm^{-2}$, less than 10 $cm^{-2}$, less than 5 $cm^{-2}$, or less than 1 $cm^{-2}$. A density of threading screw dislocations in the AlN substrate may be more than 0.1 $cm^{-2}$, more than 0.5 $cm^{-2}$, more than 1 $cm^{-2}$, more than 2 $cm^{-2}$, or more than 5 $cm^{-2}$.

A silicon concentration of the AlN substrate may be less than $1×10^{19}$ $cm^{-3}$, less than $5×10^{18}$ $cm^{-3}$, less than $1×10^{18}$ $cm^{-3}$, less than $5×10^{17}$ $cm^{-3}$, less than $3×10^{17}$ $cm^{-3}$, less than $1×10^{17}$ $cm^{-3}$, less than $5×10^{16}$ $cm^{-3}$, or less than $1×10^{16}$ $cm^{-3}$. A silicon concentration of the AlN substrate may be more than $1×10^{14}$ $cm^{-3}$, more than $5×10^{14}$ $cm^{-3}$, more than $1×10^{15}$ $cm^{-3}$, more than $5×10^{15}$ $cm^{-3}$, more than $1×10^{16}$ $cm^{-3}$, more than $5×10^{16}$ $cm^{-2}$, or more than $1×10^{17}$ $cm^{-3}$. An oxygen concentration of the AlN substrate may be less than $1×10^{19}$ $cm^{-2}$, less than $5×10^{18}$ $cm^{-2}$, less than $1×10^{18}$ $cm^{-3}$, less than $5×10^{17}$ $cm^{-3}$, less than $3×10^{17}$ $cm^{-3}$, less than $1×10^{17}$ $cm^{-3}$, less than $5×10^{16}$ $cm^{-3}$, or less than $1×10^{16}$ $cm^{-3}$. An oxygen concentration of the AlN substrate may be more than $1×10^{14}$ $cm^{-3}$, more than $5×10^{14}$ $cm^{-3}$, more than $1×10^{15}$ $cm^{-3}$, more than $5×10^{15}$ $cm^{-3}$, more than $1×10^{16}$ $cm^{-3}$, more than $5×10^{16}$ $cm^{-3}$, or more than $1×10^{17}$ $cm^{-3}$. A carbon concentration of the AlN substrate may be less than $1×10^{19}$ $cm^{-2}$, less than $5×10^{18}$ $cm^{-3}$, less than $1×10^{18}$ $cm^{-3}$, less than $5×10^{17}$ $cm^{-3}$, less than $3×10^{17}$ $cm^{-2}$, less than $1×10^{17}$ $cm^{-3}$, less than $5×10^{16}$ $cm^{-3}$, or less than $1×10^{16}$ $cm^{-3}$. A carbon concentration of the AlN substrate may be more than $1×10^{14}$ $cm^{-3}$, more than $5×10^{14}$ $cm^{-3}$, more than $1×10^{15}$ $cm^{-3}$, more than $5×10^{15}$ $cm^{-3}$, more than $1×10^{16}$ $cm^{-3}$, more than $5×10^{16}$ $cm^{-3}$, or more than $1×10^{17}$ $cm^{-3}$. The ratio of the carbon concentration of the AlN substrate to the oxygen concentration of the AlN substrate may be less than 1, less than 0.9, less than 0.8, less than 0.7, less than 0.6, less than 0.5, less than 0.4, or less than 0.3. The ratio of the carbon concentration of the AlN substrate to the oxygen concentration of the AlN substrate may be more than 0.1, more than 0.2, more than 0.3, or more than 0.4.

In another aspect, embodiments of the invention feature a single-crystalline AlN boule having a diameter of approximately 50 mm or larger and a length of approximately 15 mm or larger. The ultraviolet (UV) transparency of the AlN boule is less than 60 $cm^{-1}$ for a wavelength range of approximately 220 nm to approximately 480 nm. The oxygen concentration of the AlN boule is less than $4×10^{17}$ $cm^{-3}$, and/or the carbon concentration of the AlN boule is less than $4×10^{17}$ $cm^{-3}$. The ratio of the carbon concentration of the AlN boule to the oxygen concentration of the AlN boule is less than 1.0.

Embodiments of the invention may include one or more of the following in any of a variety of combinations. The UV transparency, for the wavelength range of approximately 220 nm to approximately 480 nm, may be less than 55 cm$^{-1}$, less than 50 cm$^{-1}$, less than 45 cm$^{-1}$, less than 40 cm$^{-1}$, less than 35 cm$^{-1}$, or less than 30 cm$^{-1}$. The UV transparency, for the wavelength range of approximately 220 nm to approximately 480 nm, may be more than 10 cm$^{-1}$, more than 15 cm$^{-1}$, more than 20 cm$^{-1}$, or more than 25 cm$^{-1}$. A silicon concentration of the AlN boule may be less than $1\times10^{19}$ cm$^{-3}$, less than $5\times10^{18}$ cm$^{-2}$, less than $1\times10^{18}$ cm$^{-2}$, less than $5\times10^{17}$ cm$^{-2}$, less than $3\times10^{17}$ cm$^{-3}$, less than $1\times10^{17}$ cm$^{-2}$, less than $5\times10^{16}$ cm$^{-2}$, or less than $1\times10^{16}$ cm'. A silicon concentration of the AlN boule may be more than $1\times10^{14}$ cm$^{-3}$, more than $5\times10^{14}$ cm$^{-2}$, more than $1\times10^{15}$ cm$^{-3}$, more than $5\times10^{15}$ cm$^{-3}$, more than $1\times10^{16}$ cm$^{-3}$, more than $5\times10^{16}$ cm$^{-3}$, or more than $1\times10^{17}$ cm$^{-3}$. An oxygen concentration of the AlN boule may be less than $3\times10^{17}$ cm$^{-3}$, less than $1\times10^{17}$ cm$^{-2}$, less than $5\times10^{16}$ cm$^{-3}$, or less than $1\times10^{16}$ cm$^{-3}$. An oxygen concentration of the AlN boule may be more than $1\times10^{14}$ cm$^{-3}$, more than $5\times10^{14}$ cm$^{-2}$, more than $1\times10^{15}$ cm$^{-3}$, more than $5\times10^{15}$ cm$^{-2}$, more than $1\times10^{16}$ cm$^{-3}$, more than $5\times10^{16}$ cm$^{-3}$, or more than $1\times10^{17}$ cm$^{-3}$. A carbon concentration of the AlN boule may be less than $3\times10^{17}$ cm$^{-3}$, less than $1\times10^{17}$ cm$^{-3}$, less than $5\times10^{16}$ cm$^{-3}$, or less than $1\times10^{16}$ cm$^{-3}$. A carbon concentration of the AlN boule may be more than $1\times10^{14}$ cm$^{-3}$, more than $5\times10^{14}$ cm$^{-3}$, more than $1\times10^{15}$ cm$^{-3}$, more than $5\times10^{15}$ cm$^{-2}$, more than $1\times10^{16}$ cm$^{-2}$, more than $5\times10^{16}$ cm$^{-3}$, or more than $1\times10^{17}$ cm$^{-3}$. The ratio of the carbon concentration of the AlN boule to the oxygen concentration of the AlN boule may be less than 0.9, less than 0.8, less than 0.7, less than 0.6, less than 0.5, less than 0.4, or less than 0.3. The ratio of the carbon concentration of the AlN boule to the oxygen concentration of the AlN boule may be more than 0.1, more than 0.2, more than 0.3, or more than 0.4.

The length of the boule may be approximately 17 mm or larger, approximately 20 mm or larger, approximately 25 mm or larger, approximately 30 mm or larger, or approximately 35 mm or larger. The length of the boule may be approximately 50 mm or less, approximately 45 mm or less, approximately 40 mm or less, or approximately 35 mm or less. The diameter of the AlN boule may be approximately 50 mm. The diameter of the AlN boule may be at least approximately 60 mm, at least approximately 65 mm, at least approximately 70 mm, at least approximately 75 mm, at least approximately 80 mm, at least approximately 85 mm, at least approximately 90 mm, at least approximately 95 mm, or at least approximately 100 mm. The diameter of the AlN boule may be no greater than approximately 150 mm, no greater than approximately 125 mm, no greater than approximately 110 mm, or no greater than approximately 100 mm. The thermal conductivity of the AlN boule may be, at room temperature, approximately 250 W/m·K or greater, approximately 270 W/m·K or greater, approximately 290 W/m·K or greater, approximately 300 W/m·K or greater, or approximately 320 W/m·K or greater. The thermal conductivity of the AlN boule may be, at room temperature, approximately 400 W/m·K or less, approximately 350 W/m·K or less, or approximately 300 W/m·K or less.

A full-width at half-maximum (FWHM) of an x-ray diffraction curve of the AlN boule may be less than 85 arcsec, less than 80 arcsec, less than 75 arcsec, less than 70 arcsec, less than 65 arcsec, less than 60 arcsec, less than 55 arcsec, less than 50 arcsec, less than 45 arcsec, or less than 40 arcsec. A FWHM of an x-ray diffraction curve of the AlN boule may be more than 10 arcsec, more than 15 arcsec, more than 20 arcsec, more than 25 arcsec, more than 30 arcsec, more than 35 arcsec, more than 40 arc sec, or more than 45 arcsec. A density of threading edge dislocations in the AlN boule may be less than $5\times10^5$ cm$^{-2}$, less than $1\times10^5$ cm$^{-2}$, less than $5\times10^4$ cm$^{-2}$, less than $1\times10^4$ cm$^{-2}$, less than $5\times10^3$ cm$^{-2}$, or less than $1\times10^3$ cm$^{-2}$. A density of threading edge dislocations in the AlN boule may be more than 10 cm$^{-2}$, more than 100 cm$^{-2}$, more than 500 cm$^{-2}$, or more than 1000 cm$^{-2}$. A density of threading screw dislocations in the AlN boule may be less than 100 cm$^{-2}$, less than 50 cm$^{-2}$, less than 10 cm$^{-2}$, less than 5 cm$^{-2}$, or less than 1 cm$^{-2}$. A density of threading screw dislocations in the AlN boule may be more than 0.1 cm$^{-2}$, more than 0.5 cm$^{-2}$, more than 1 cm$^{-2}$, more than 2 cm$^{-2}$, or more than 5 cm$^{-2}$. The UV transparency of the boule, for the wavelength range of approximately 350 nm to approximately 480 nm, may be less than 25 cm$^{-1}$, less than 20 cm$^{-1}$, less than 15 cm$^{-2}$, less than 10 cm$^{-1}$, less than 8 cm$^{-1}$, or less than 5 cm$^{-1}$. The UV transparency, for the wavelength range of approximately 350 nm to approximately 480 nm, may be more than 1 cm$^{-1}$, more than 3 cm$^{-1}$, more than 5 cm$^{-1}$, or more than 8 cm$^{-1}$.

In yet another aspect, embodiments of the invention feature a method of improving ultraviolet (UV) transparency of a single-crystal AlN bulk crystal. The AlN bulk crystal is heated to an annealing temperature of at least 1800° C., at least 1900° C., at least 1950° C., or at least 2000° C. Thereafter, the AlN bulk crystal is cooled via a cooling cycle. The cooling cycle includes, consists essentially of, or consists of (i) cooling the AlN bulk crystal from the annealing temperature to a first temperature ranging from 1450° C. to 2150° C. over a first time ranging from 10 minutes to 90 minutes, and (ii) thereafter, cooling the AlN bulk crystal from the first temperature to a second temperature ranging from 1000° C. to 1650° C. over a second time ranging from 10 seconds to 10 minutes, or (i) cooling the AlN bulk crystal from the annealing temperature to a third temperature ranging from 1450° C. to 2150° C. over a third time ranging from 10 seconds to 10 minutes, and (ii) thereafter, cooling the AlN bulk crystal from the third temperature to a fourth temperature ranging from 1000° C. to 1650° C. over a fourth time ranging from 10 minutes to 90 minutes. Thereafter, the AlN bulk crystal is cooled to approximately room temperature.

Embodiments of the invention may include one or more of the following in any of a variety of combinations. After heating the AlN bulk crystal to the annealing temperature and before cooling the AlN bulk crystal via the cooling cycle, the AlN bulk crystal may be maintained at the annealing temperature for a soak time. The soak time may be at least approximately 1 hour, at least approximately 2 hours, at least approximately 3 hours, at least approximately 4 hours, at least approximately 5 hours, or at least approximately 6 hours. The soak time may be at most approximately 10 hours, at most approximately 9 hours, at most approximately 8 hours, at most approximately 7 hours, at most approximately 6 hours, or at most approximately 5 hours. The soak time may be approximately 5 hours. The diameter of at least a portion (or even all) of the AlN bulk crystal may be at least approximately 35 mm, at least approximately 50 mm, at least approximately 75 mm, or at least approximately 100 mm. The diameter of at least a portion (or even all) of the AlN bulk crystal may be at most approximately 150 mm, at most approximately 125 mm, at most approximately 100 mm, or at most approximately 75 mm. The diameter of at least a portion (or even all) of the AlN bulk crystal may be approximately 50 mm.

A light-emitting device may be fabricated over at least a portion of the AlN bulk crystal. The light-emitting device may be configured to emit ultraviolet light. After forming at least a portion of the light-emitting device (e.g., all or a portion of an epitaxial light-emitting layer structure), at least a portion (or even all) of the AlN bulk crystal may be removed from the light-emitting device. The light-emitting device may include, consist essentially of, or consist of a light-emitting diode and/or a laser. Embodiments of the invention may include AlN bulk crystals formed in accordance with any of the methods described above.

In another aspect, embodiments of the invention feature a method of improving ultraviolet (UV) transparency of a single-crystal AlN bulk crystal. The AlN bulk crystal is heated to an annealing temperature of at least 1800° C., at least 1900° C., at least 1950° C., or at least 2000° C. Thereafter, the AlN bulk crystal is cooled via a cooling cycle. The cooling cycle includes, consists essentially of, or consists of cooling the AlN bulk crystal from the annealing temperature to a first temperature ranging from 1000° C. to 1650° C. over a time period ranging from 1 hour to 10 hours, and thereafter, cooling the AlN bulk crystal to approximately room temperature.

Embodiments of the invention may include one or more of the following in any of a variety of combinations. After heating the AlN bulk crystal to the annealing temperature and before cooling the AlN bulk crystal via the cooling cycle, the AlN bulk crystal may be maintained at the annealing temperature for a soak time. The soak time may be at least approximately 1 hour, at least approximately 2 hours, at least approximately 3 hours, at least approximately 4 hours, at least approximately 5 hours, or at least approximately 6 hours. The soak time may be at most approximately 10 hours, at most approximately 9 hours, at most approximately 8 hours, at most approximately 7 hours, at most approximately 6 hours, or at most approximately 5 hours. The soak time may be approximately 5 hours. The diameter of at least a portion (or even all) of the AlN bulk crystal may be at least approximately 35 mm, at least approximately 50 mm, at least approximately 75 mm, or at least approximately 100 mm. The diameter of at least a portion (or even all) of the AlN bulk crystal may be at most approximately 150 mm, at most approximately 125 mm, at most approximately 100 mm, or at most approximately 75 mm. The diameter of at least a portion (or even all) of the AlN bulk crystal may be approximately 50 mm.

A light-emitting device may be fabricated over at least a portion of the AlN bulk crystal. The light-emitting device may be configured to emit ultraviolet light. After forming at least a portion of the light-emitting device (e.g., all or a portion of an epitaxial light-emitting layer structure), at least a portion (or even all) of the AlN bulk crystal may be removed from the light-emitting device. The light-emitting device may include, consist essentially of, or consist of a light-emitting diode and/or a laser. Embodiments of the invention may include AlN bulk crystals formed in accordance with any of the methods described above.

In yet another aspect, embodiments of the invention feature a method of forming a polycrystalline AlN source. A bulk polycrystalline AlN ceramic is provided. At least a portion of the AlN ceramic is disposed into a crucible. The at least a portion of the AlN ceramic is annealed and densified in the crucible, thereby forming a polycrystalline AlN source. The annealing and densifying includes, consists essentially of, or consists of (i) heating the at least a portion of the AlN ceramic at a first temperature ranging from 1100° C. to 1900° C. for a first time ranging from 2 hours to 25 hours, and (ii) thereafter, heating the at least a portion of the AlN ceramic at a second temperature ranging from 1900° C. to 2250° C. for a second time ranging from 3 hours to 15 hours, or (i) heating the at least a portion of the AlN ceramic during a temperature ramp to a third temperature ranging from 1900° C. to 2250° C. over a third time ranging from 5 hours to 25 hours, and (ii) thereafter, heating the at least a portion of the AlN ceramic at a fourth temperature ranging from 1900° C. to 2250° C. for a fourth time ranging from 3 hours to 25 hours. The AlN source is cooled to approximately room temperature.

Embodiments of the invention may include one or more of the following in any of a variety of combinations. Prior to disposing the at least a portion of the AlN ceramic into the crucible, the AlN ceramic may be fragmented into fragments. One or more (or even each) of the fragments may have a width (or diameter, or length, or other dimension) greater than approximately 0.1 cm, greater than approximately 0.2 cm, greater than approximately 0.3 cm, greater than approximately 0.4 cm, greater than approximately 0.5 cm, greater than approximately 0.7 cm, or greater than approximately 1 cm. One or more (or even each) of the fragments may have a width (or diameter, or length, or other dimension) less than approximately 5 cm, less than approximately 4 cm, less than approximately 3 cm, less than approximately 2 cm, less than approximately 1.5 cm, or less than approximately 1 cm. The at least a portion of the AlN ceramic may include, consist essentially of, or consist of one or more of the fragments. The bulk polycrystalline AlN ceramic may have less than approximately 1% excess Al and/or an oxygen concentration less than $2 \times 10^{19}$ cm$^{-3}$. Embodiments of the invention may include polycrystalline AlN sources formed in accordance with any of the above methods.

In another aspect, embodiments of the invention feature a method of forming single-crystal aluminum nitride (AlN). A bulk polycrystalline AlN ceramic is provided. At least a portion of the AlN ceramic is disposed into a first crucible. The at least a portion of the AlN ceramic is annealed and densified in the first crucible, thereby forming a polycrystalline AlN source. The annealing and densifying includes, consists essentially of, or consists of (i) heating the at least a portion of the AlN ceramic at a first temperature ranging from 1100° C. to 1900° C. for a first time ranging from 2 hours to 25 hours, and (ii) thereafter, heating the at least a portion of the AlN ceramic at a second temperature ranging from 1900° C. to 2250° C. for a second time ranging from 3 hours to 15 hours, or (i) heating the at least a portion of the AlN ceramic during a temperature ramp to a third temperature ranging from 1900° C. to 2250° C. over a third time ranging from 5 hours to 25 hours, and (ii) thereafter, heating the at least a portion of the AlN ceramic at a fourth temperature ranging from 1900° C. to 2250° C. for a fourth time ranging from 3 hours to 25 hours. The AlN source is cooled to approximately room temperature. A second crucible is disposed within a furnace. The second crucible contains the AlN source and a seed crystal that includes, consists essentially of, or consists of single-crystal AlN. The second crucible is heated with the furnace to a growth temperature of at least 2000° C. The second crucible is maintained at the growth temperature for a soak time ranging from 1 hour to 10 hours. After the soak time, while the second crucible is at the growth temperature, (i) vapor including, consisting essentially of, or consisting of aluminum and nitrogen is condensed on the seed crystal, thereby forming a single-crystalline AlN boule extending from the seed crystal, and (ii) the second crucible is moved relative to the furnace. The growth rate of at least a portion of the AlN boule is approximately equal to a rate of relative motion between the second crucible and the furnace. Thereafter, the AlN boule is cooled via a cooling cycle. The cooling cycle includes, consists essentially of, or consists of cooling the AlN boule from the growth temperature to a fifth temperature ranging from 1000° C. to 1650° C. over a fifth time ranging from 1 hour to 10 hours, and thereafter, cooling the AlN boule to approximately room temperature.

Embodiments of the invention may include one or more of the following in any of a variety of combinations. The growth temperature may be approximately 2300° C. or less, approximately 2200° C. or less, or approximately 2100° C. or less. The diameter of at least a portion (or even all) of the AlN boule may be at least approximately 35 mm, at least approximately 50 mm, at least approximately 75 mm, or at least approximately 100 mm. The diameter of at least a portion (or even all) of the AlN boule may be at most approximately 150 mm, at most approximately 125 mm, at most approximately 100 mm, or at most approximately 75 mm. The diameter of at least a portion (or even all) of the AlN boule may be approximately 50 mm. Oxygen (e.g., oxygen gas or an oxygen-containing gas) may be introduced into the second crucible during formation of the single-crystalline AlN boule extending from the seed crystal. Prior to disposing the at least a portion of the AlN ceramic into the first crucible, the AlN ceramic may be fragmented into fragments. One or more (or even each) of the fragments may have a width (or diameter, or length, or other dimension) greater than approximately 0.1 cm, greater than approximately 0.2 cm, greater than approximately 0.3 cm, greater than approximately 0.4 cm, greater than approximately 0.5 cm, greater than approximately 0.7 cm, or greater than approximately 1 cm. One or more (or even each) of the fragments may have a width (or diameter, or length, or other dimension) less than approximately 5 cm, less than approximately 4 cm, less than approximately 3 cm, less than approximately 2 cm, less than approximately 1.5 cm, or less than approximately 1 cm. The at least a portion of the AlN ceramic may include, consist essentially of, or consist of one or more of the fragments.

A crystalline orientation of the seed crystal may be substantially parallel to a c-axis. The first crucible and the second crucible may be the same crucible or different crucibles. The growth rate may be at least 0.1 mm/hour, at least 0.2 mm/hour, at least 0.3 mm/hour, at least 0.4 mm/hour, at least 0.5 mm/hour, at least 0.7 mm/hour, or at least 1 mm/hour. The growth rate may be at most 3 mm/hour, at most 2.5 mm/hour, at most 2 mm/hour, at most 1.5 mm/hour, or at most 1 mm/hour. The soak time may be at least approximately 2 hours, at least approximately 3 hours, at least approximately 4 hours, at least approximately 5 hours, or at least approximately 6 hours. The soak time may be at most approximately 9 hours, at most approximately 8 hours, at most approximately 7 hours, at most approximately 6 hours, or at most approximately 5 hours. The soak time may be approximately 5 hours. The diameter of the seed crystal may be approximately 25 mm or larger, approximately 30 mm or larger, approximately 35 mm or larger, approximately 40 mm or larger, approximately 45 mm or larger, or approximately 50 mm or larger. The diameter of the seed crystal may be approximately 150 mm or smaller, approximately 100 mm or smaller, approximately 75 mm or smaller, or approximately 50 mm or smaller.

The AlN boule may be sliced to form a single-crystalline AlN substrate having a diameter of at least 25 mm, at least 30 mm, at least 35 mm, at least 40 mm, at least 45 mm, or at least 50 mm. The diameter of the single-crystalline AlN substrate may be approximately 150 mm or smaller, approximately 100 mm or smaller, approximately 75 mm or smaller, or approximately 50 mm or smaller. The diameter of the single-crystalline AlN substrate may be approximately 50 mm. A light-emitting device may be fabricated over at least a portion of the AlN substrate. The light-emitting device may be configured to emit ultraviolet light. After forming at least a portion of the light-emitting device (e.g., all or a portion of an epitaxial light-emitting layer structure), at least a portion (or even all) of the AlN substrate may be removed from the light-emitting device. The light-emitting device may include, consist essentially of, or consist of a light-emitting diode and/or a laser.

Oxygen and/or carbon may be gettered during formation of the single-crystalline AlN boule. The oxygen and/or carbon may be gettered with a gettering material introduced into the second crucible and/or the furnace prior to and/or during formation of the single-crystalline AlN boule. The gettering material may have a melting point greater than the growth temperature and/or a eutectic melting point with AlN greater than the growth temperature. The gettering material may include, consist essentially of, or consist of boron, iridium, niobium, molybdenum, tantalum, tungsten, and/or rhenium. The bulk polycrystalline AlN ceramic may have less than approximately 1% excess Al and/or an oxygen concentration less than $2 \times 10^{19}$ cm$^{-3}$. Embodiments of the invention may include AlN boules and/or substrates formed in accordance with any of the above methods.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations. As used herein, the terms "approximately," "about," and "substantially" mean±10%, and in some embodiments, ±5%. All numerical ranges specified herein are inclusive of their endpoints unless otherwise specified. The term "consists essentially of" means excluding other materials that contribute to function, unless otherwise defined herein. Nonetheless, such other materials may be present, collectively or individually, in trace amounts.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIG. 5B is a table of data showing Si, O, and C concentrations, as well as UV absorption coefficients, for the measurement sites indicated by the circles on FIG. 5A;

DETAILED DESCRIPTION

Figure 1A:
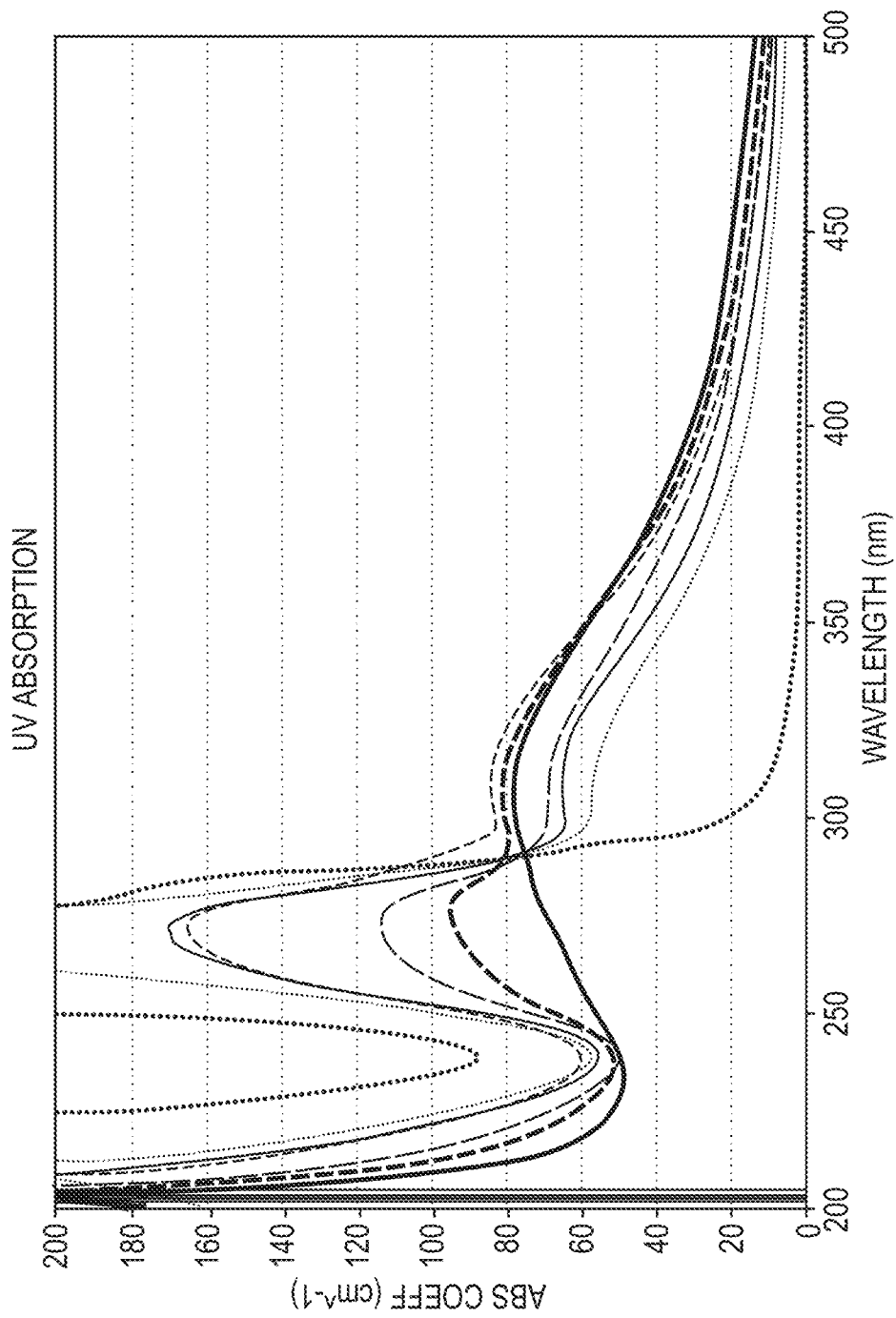
FIG. 1A is a graph of UV absorption coefficients, as a function of wavelength, for AlN wafers produced utilizing conventional growth techniques.
Figure 1B:
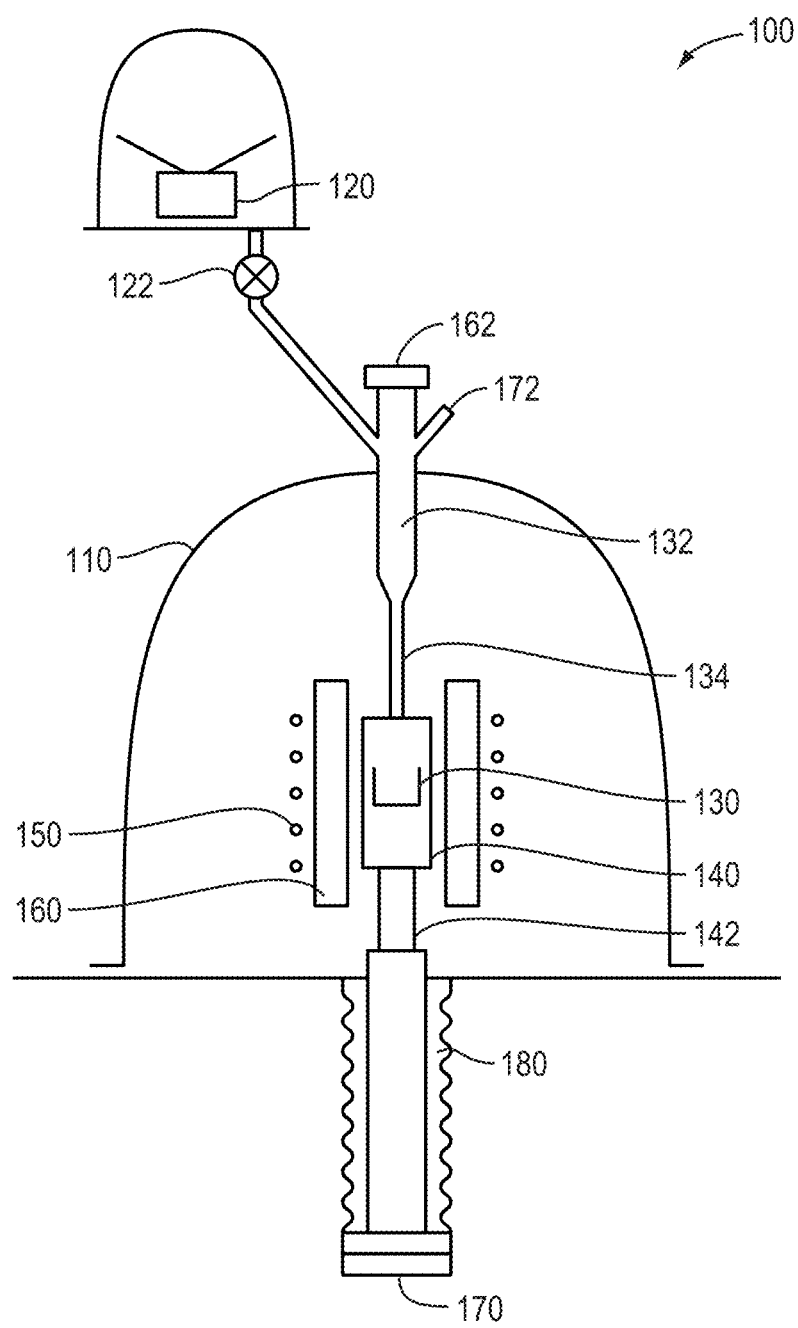
FIGS. 1B-1D are schematic diagrams of a reactor utilized for the formation of polycrystalline source material in accordance with various embodiments of the invention.
Figure 1C:
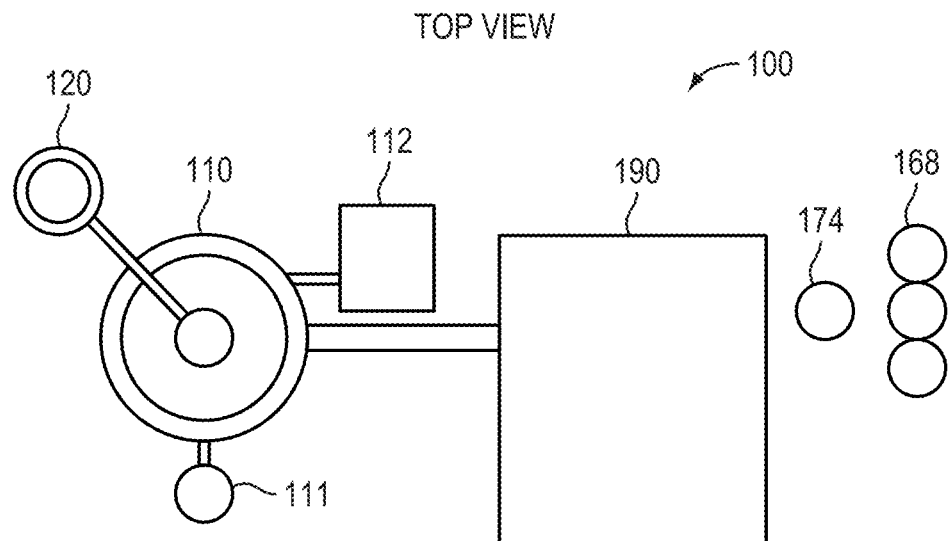
Figure 1D:
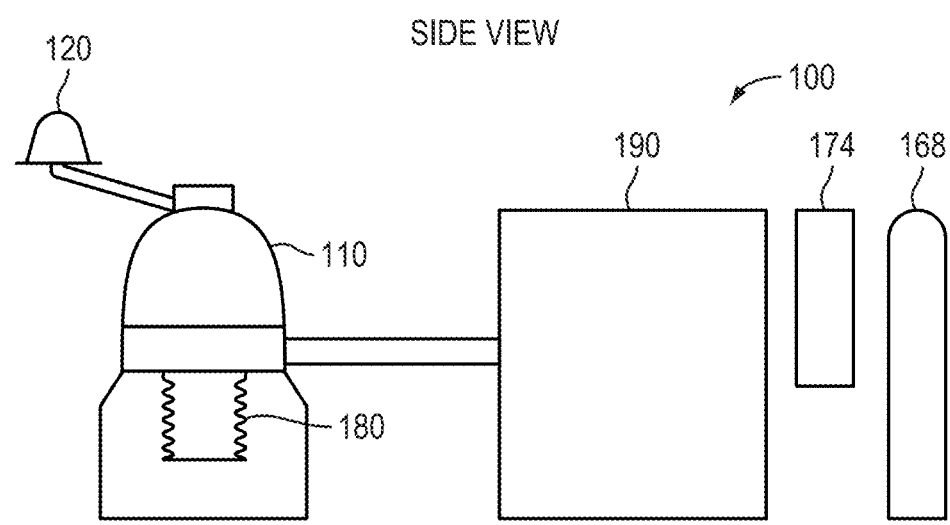
Figure 1E:
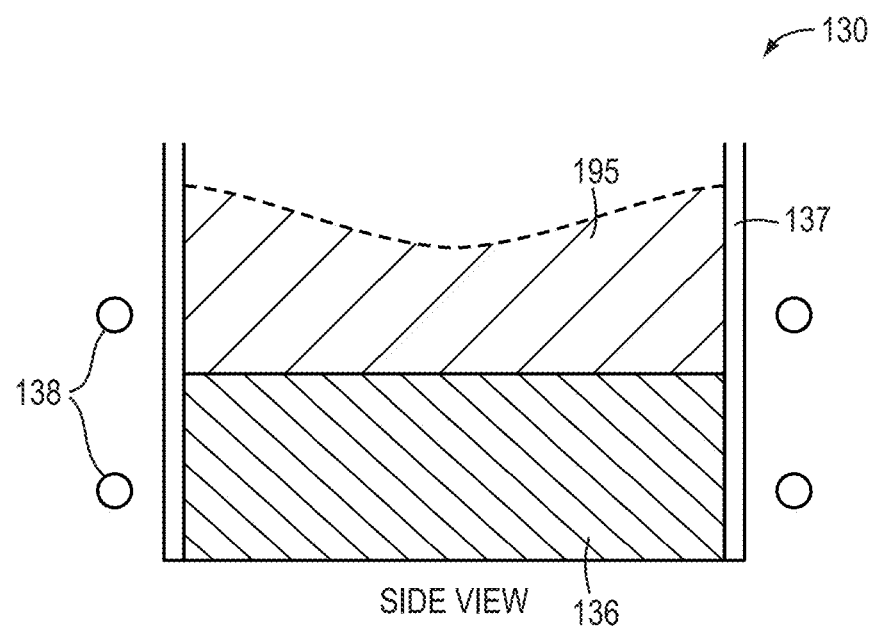
FIGS. 1E and 1F are schematic diagrams of a crucible utilized for the formation of polycrystalline source material in accordance with various embodiments of the invention.
Figure 1F:
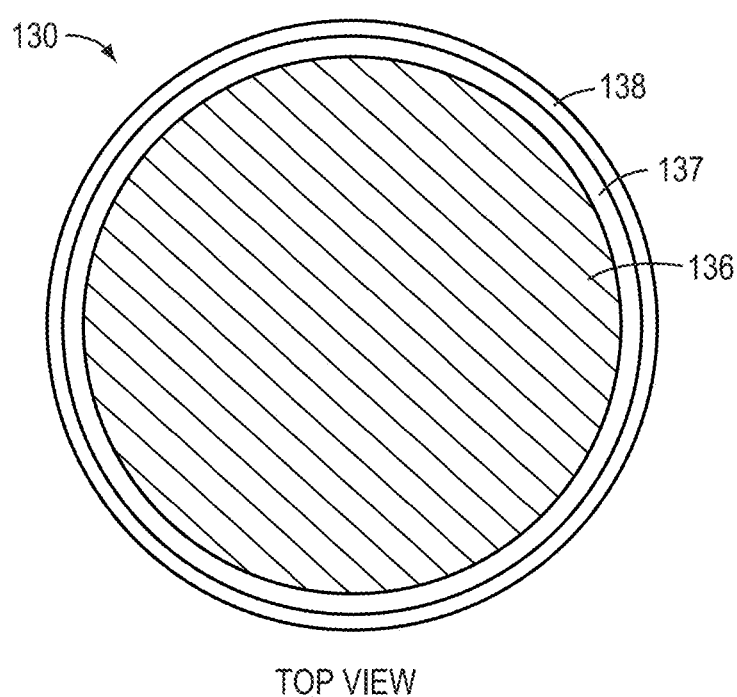

Embodiments of the present invention enable the fabrication of high-quality, highly UV-transparent single-crystal AlN bulk crystals (i.e., boules and/or substrates). In various embodiments, production of such AlN bulk crystals begins with a two-stage process of fabricating highly stoichiometric polycrystalline AlN source material that may be utilized in a vapor-transport growth process (e.g., sublimation-recondensation) to form the AlN bulk crystals. The formation of the AlN source material, in various embodiments, minimizes concentrations of UV-transparency-compromising contaminants such as carbon (C) and oxygen (O).

In various embodiments, the first stage of production of the AlN source material proceeds with the formation of a polycrystalline AlN ceramic from high-purity Al pellets as detailed in the '519 patent. For example, referring to FIGS. 1B-1F, a reactor 100 may be utilized in the formation of a polycrystalline AlN ceramic 195 that includes, consists essentially of, or consists of high-purity AlN. Reactor 100 may include a reaction vessel 110, which may be fabricated of double-walled stainless steel and may be water cooled. Reaction vessel 110 may be capable of a maximum internal gas pressure of approximately 45 pounds per square inch (psi), and may be evacuated, e.g., by a turbo pump 111 (backed by a mechanical pump 112) to approximately $10^{-7}$ Torr. A feeder mechanism 120 is connected to the top of reaction vessel 110, and may be evacuated and pressurized with the same gases and pressures as reaction vessel 110. Feeder mechanism 120 may be isolated from reaction vessel 110 by an isolation valve 122. Pellets (which may include, consist essentially of, or consist of high (e.g., five nines) purity undoped Al and may be shaped approximately cylindrically) released from feeder mechanism 120 are directed to a crucible 130 by an upper funnel 132 and a lower funnel 134.

In various embodiments, crucible 130 includes, consists essentially of, or consists of a bottom plug 136 and a foil wrap 137. Bottom plug 136 may be approximately cylindrical with, e.g., a diameter of approximately 2 inches and a height of approximately 0.5 inches. Bottom plug 136 may include, consist essentially of, or consist of tungsten (W) or another high-melting-point material inert to AlN. Foil wrap 137 wraps around bottom plug 136, forming a cylinder open at the top and sealed at the bottom by bottom plug 136. Foil wrap 137 may include, consist essentially of, or consist of W, or another high melting point material inert to AlN, and may have a thickness of approximately 0.001 inch. In an embodiment, foil wrap 137 may be wrapped around bottom plug 136 multiple times, e.g., a three-ply foil wrap 137 is formed by wrapping W foil around bottom plug 137 three times. Foil wrap 137 may be held in place by wire 138. Wire 138 may include, consist essentially of, or consist of a tungsten-rhenium alloy (e.g., 25% rhenium) and have a thickness of approximately 0.01 inch.

As shown, crucible 130 is disposed within a reaction zone 140 and on top of a crucible stand 142. Both reaction zone 140 and crucible stand 142 may include, consist essentially of, or consist of W. Lower funnel 134 is disposed above the top opening of crucible 130, and may include, consist essentially of, or consist of W. Lower funnel 134 is shaped to direct pellets from feeder mechanism 120 and upper funnel 132 into crucible 130.

Reactor 100 includes an inductive heating coil 150, which wraps around insulation 160. Insulation 160 may include, consist essentially of, or consist of bubble alumina available from Zircar Ceramics, Inc. of Florida, New York held within a quartz holder. Inductive heating coil 150 may be a 10 kHz, 20 kilowatt inductive heating system available from Mesta Electronics, Inc. of N. Huntingdon, Pa., and may heat to temperatures up to approximately 2300° C. An optical pyrometer port 162 enables the measurement of temperature inside the reaction zone defined by inductive heating coil 150 by pyrometry. Gas from a series of gas tanks representatively indicated at 168 flows into reactor 100 from a bottom inlet 170 and/or a top inlet 172. The gas may include, consist essentially of, or consist of nitrogen or forming gas, and is filtered by a gas filter 174 that reduces levels of contaminants such as oxygen, water vapor, and hydrocarbons to less than 10 ppb. A vertical drive 180 is used to move crucible 130 in and out of the hot zone created by inductive heating coil 150. A conventional control station 190 includes electronic controls and power supplies for all of the components associated with reactor 100.

In order to form the polycrystalline ceramic 195, pellets are cleaned in preparation for loading into feeder mechanism 120. First, the pellets are sifted (with or without water) in order to remove oddly shaped pellets or small shavings. The pellets are then ultrasonically cleaned in methanol (e.g., for a time period of approximately 20 minutes), etched in hydrochloric acid (HCl) (e.g., for a time period of approximately 7 minutes), and rinsed several times (e.g. three times) in distilled water. After another ultrasonic clean in methanol (e.g., for a time period of approximately 20 minutes), the pellets are immersed in a mixture of HF and $HNO_3$ (e.g., for a time period of approximately 2 minutes) at room temperature. Finally, the pellets are rinsed in distilled water and multiple times in methanol, whereupon they may be stored in an inert or nitrogen atmosphere prior to loading in feeder mechanism 120.

Crucible 130 is loaded into reactor 100, and pellets are loaded into feeder mechanism 120. Reaction chamber 110 and feeder mechanism 120 are evacuated, e.g., to a pressure less than approximately $5 \times 10^{-5}$ Torr, and refilled with forming gas to a pressure of approximately 6 psi. Either nitrogen ($N_2$) gas or forming gas flows into reaction chamber 110 from bottom inlet 170 and/or top inlet 172 at a rate of approximately 0.25 lpm. The flow of gas provides a sufficient amount of nitrogen in reaction chamber 110 to convert the pellet(s) to AlN (as described below). Inductive heating coil 150 may heat crucible 130 to approximately 1900-2200° C., although even higher temperatures may be utilized. In an embodiment, inductive heating coil 150 heats crucible 130 to approximately 2000-2050° C. Temperatures in this range have been found to be sufficient to totally react the pellets into stoichiometric AlN (which includes less than approximately 1% unreacted Al) and to drive off higher vapor pressure impurities that may be trapped within polycrystalline ceramic 130 and create optical absorptions. The temperature at crucible 130 may be measured by pyrometry through optical pyrometer port 162. Once crucible 130 reaches the desired temperature, the temperature and gas flow conditions within reactor 100 are held constant for a pre-soak cycle (e.g., approximately 3 hours). The pre-soak cleans crucible 130 and other parts of reactor 100 of contaminants, e.g., oxides, before the introduction of the Al pellets.

A reaction cycle is then performed to form polycrystalline ceramic 195. Pellets are dropped from feeder mechanism 120, through upper funnel 132 and lower funnel 134, into crucible 130. The pellets may each weigh approximately 0.23 gram, and may be dropped at a rate of approximately 1 every 90 seconds. Feeder mechanism 120 may incorporate an optical counter that counts actual pellet drops and may cycle feeder mechanism 120 to drop an additional pellet in case of a loading error. The pellets land on bottom plug 136 (or the portion of polycrystalline ceramic 195 already produced thereon), melt, and react with the nitrogen gas to form polycrystalline ceramic 195. Each subsequent pellet dropped from feeder mechanism 120 reacts and increases the size and volume of polycrystalline ceramic 195. In an embodiment, substantially all of each pellet reacts to form polycrystalline ceramic 195. After a desired number of pellets are reacted to form polycrystalline ceramic 195, the reaction gas flow rate and temperature are maintained for a time period (e.g., approximately 1 hour) to ensure that the reaction is complete.

After the reaction cycle, crucible 130 (and polycrystalline ceramic 195) may be cooled down to approximately room temperature at a positive nitrogen pressure (e.g., over a time period of approximately 1 hour). Thus formed, polycrystalline ceramic 195 includes, consists essentially of, or consists of high-purity AlN. In an embodiment, an oxygen concentration (and/or concentration of other impurities such as boron or transition metals) of polycrystalline ceramic 195 is less than approximately 400 ppm by weight, and may even be less than approximately 100 ppm. In various embodiments, the oxygen concentration of polycrystalline ceramic 195, as measured by instrumental gas analysis (IGA), ranges from approximately $5.3 \times 10^{19}$ cm' to approximately $6.1 \times 10^{19}$ $cm^{-3}$. In various embodiments, the carbon concentration of polycrystalline ceramic 195, as measured by IGA, ranges from approximately $1.9 \times 10^{20}$ $cm^{-3}$ to approximately $2.6 \times 10^{20}$ $cm^{-3}$.

Polycrystalline ceramic 195 includes, consists essentially of, or consists of AlN that is approximately stoichiometric, i.e., AlN that contains less than approximately 1% excess Al, less than approximately 0.5% excess Al, or even less than approximately 0.1% excess Al. After formation, polycrystalline ceramic 195 may be stored in an inert atmosphere in preparation for utilization thereof to fabricate high-quality polycrystalline AlN source material.

While the polycrystalline AlN ceramic 195 may contain advantageously low concentrations of oxygen, various embodiments of the present invention feature a second stage of preparation that reduces or minimizes concentrations of other contaminants such as carbon. In various embodiments, this second stage involves an annealing and densification treatment of at least a portion of polycrystalline ceramic 195 to form high-quality polycrystalline AlN source material. In various embodiments, the ceramic 195 is broken up into fragments before the annealing and densification treatment. The ceramic 195 may be fragmented by, e.g., application of mechanical force, and one or more (typically more) of the fragments are collected and placed into a crucible (which may resemble crucible 130 or simply be a W vessel) for subsequent heat treatment. In various embodiments, larger fragments (e.g., ones having widths, diameters, or other lateral dimensions ranging from 0.5 cm to 2 cm) are utilized while use of smaller particles or dust from ceramic 195 (e.g., particles having large aggregate surface area) is avoided to avoid excess carbon contamination. For example, the fragments may be separated on the basis of size using one or more sieves, and/or compressed air or another fluid may be applied to the fragments to minimize or reduce the amount of dust or other particles thereon. In other embodiments, substantially the entire ceramic 195 is placed into the crucible and heat treated to form the polycrystalline AlN source material.

Figure 1G:
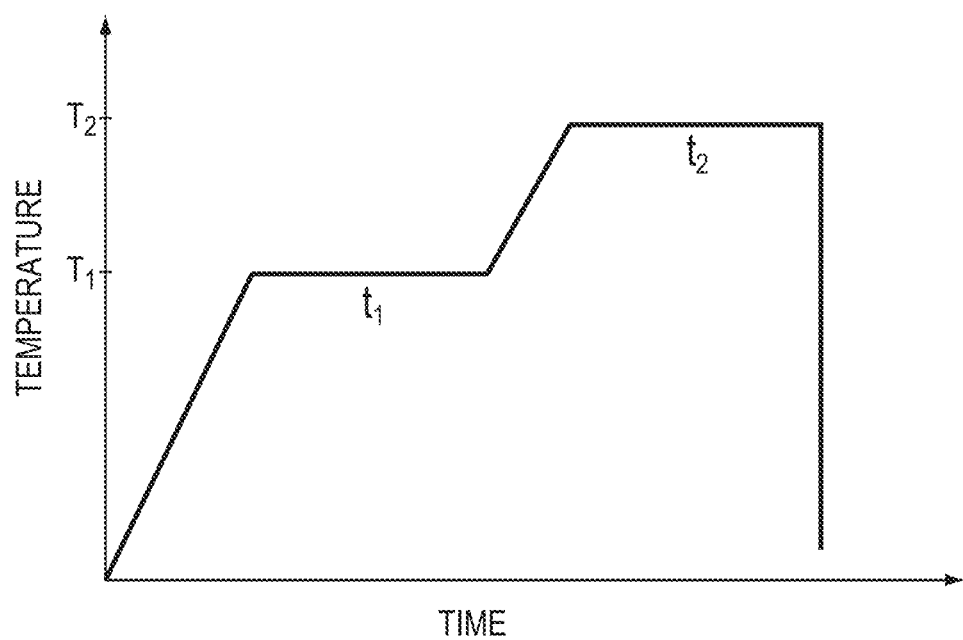
FIGS. 1G and 1H are graphs of example heat treatments for the formation of polycrystalline source material in accordance with various embodiments of the invention.

As shown in FIG. 1G, in accordance with various embodiments of the invention, the ceramic 195 (or portion thereof) may be heated to a first temperature T1 ranging from 1100° C. to 1900° C. and held at temperature T1 for a time period t1 of, for example, 2 hours to 25 hours. Thereafter, the ceramic 195 (or portion thereof) may be heated to a higher second temperature T2 (e.g., a temperature ranging from 1900° C. to 2250° C.) and held at temperature T2 for a time period t2 of, for example, 3 hours to 15 hours. During the heat treatment, the ceramic 195 (or portion thereof) is annealed and densified to form a polycrystalline AlN source material that may be utilized in the subsequent formation of high-quality single-crystal AlN bulk crystals. Because the polycrystalline AlN source material is generally approximately stoichiometric AlN with low concentrations of impurities, it may be used to form an AlN bulk crystal without further preparation (e.g., without intermediate sublimation-recondensation steps).

Figure 1H:
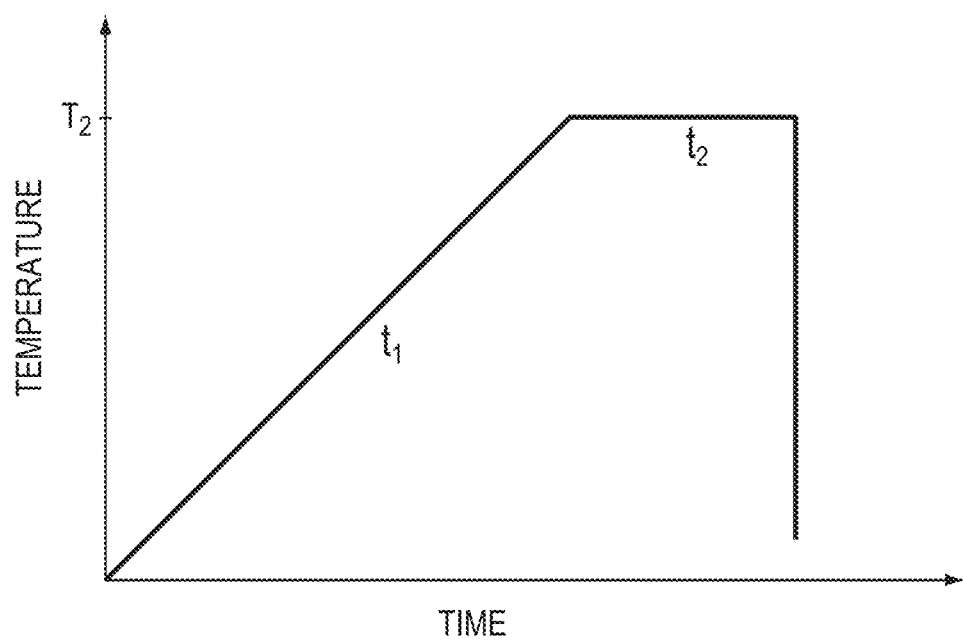

FIG. 1H schematically depicts an alternative to the heat treatment depicted in FIG. 1G in which a longer ramp to temperature T2 is utilized in place of the first annealing step at temperature T1. As shown in FIG. 1H, in accordance with various embodiments of the invention, the ceramic 195 (or portion thereof) may be ramped to temperature T2 (e.g., a temperature ranging from 1900° C. to 2250° C.) over a time period t1 ranging from, for example, 5 hours to 25 hours. Thereafter, the ceramic 195 (or portion thereof) may be held at temperature T2 for a time period t2 of, for example, 3 hours to 25 hours. During the heat treatment, the ceramic 195 (or portion thereof) is annealed and densified to form a polycrystalline AlN source material that may be utilized in the subsequent formation of high-quality single-crystal AlN bulk crystals. Because the polycrystalline AlN source material is generally approximately stoichiometric AlN with low concentrations of impurities, it may be used to form an AlN bulk crystal without further preparation (e.g., without intermediate sublimation-recondensation steps).

In various embodiments, the oxygen concentration of the resulting polycrystalline AlN source material, as measured by instrumental gas analysis (IGA), ranges from approximately $1.0 \times 10^{19}$ cm$^{-3}$ to approximately $3.0 \times 10^{19}$ cm$^{-3}$. In various embodiments, the carbon concentration of the polycrystalline AlN source material, as measured by IGA, ranges from approximately $3.8 \times 10^{18}$ cm$^{-3}$ to approximately $1.8 \times 10^{19}$ cm$^{-3}$. The density of the polycrystalline AlN source material, as measured by pycnometry at room temperature, is approximately equal to that of single-crystal AlN, i.e., approximately 3.25 g/cm$^3$ to 3.26 g/cm$^3$. In contrast, the measured density of the AlN ceramic 195 is lower than that of the polycrystalline AlN source material, e.g., approximately 2.95 g/cm$^3$ to approximately 3.20 g/cm$^3$. In addition, the polycrystalline AlN source material typically has an amber color and is composed of fairly large grains (e.g., average grain diameter ranging from approximately 0.1 mm to approximately 5 mm).

Figure 2:
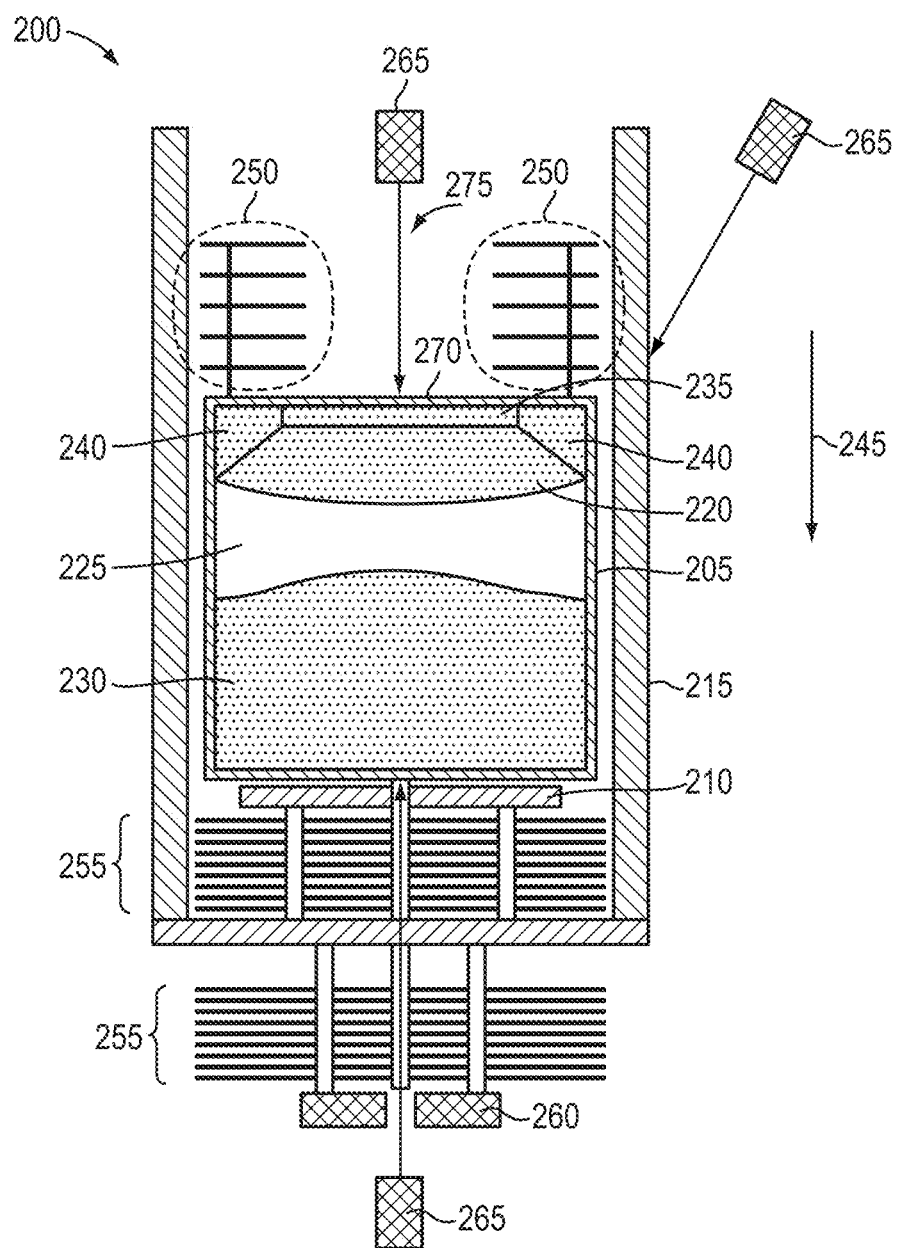
FIG. 2 is a schematic diagram of an apparatus for the growth of single-crystal AlN in accordance with various embodiments of the invention.

FIG. 2 depicts a crystal-growth apparatus 200 suitable for the growth of single-crystal AlN in accordance with various embodiments of the present invention. As shown, apparatus 200 includes a crucible 205 positioned on top of a crucible stand 210 within a susceptor 215. Both the crucible 205 and the susceptor 215 may have any suitable geometric shape, e.g., cylindrical. During a typical growth process, an AlN boule 220 is formed by condensation of a vapor 225 that includes or consists essentially of the elemental precursors of the AlN boule 220, i.e., Al and N atoms and/or N$_2$ molecules. In typical embodiments, the vapor 225 arises from the sublimation of a source material 230, which may include, consist essentially of, or consist of the polycrystalline AlN source material derived from ceramic 195 and described above. The AlN boule 220 may form on and extend from a seed crystal 235. (Alternatively, the AlN boule 220 may nucleate upon and extend from a portion of the crucible 205 itself.) The seed crystal 235 may be a single crystal (e.g., a polished wafer) including, consisting essentially of, or consisting of AlN. In various embodiments, the seed crystal 235 has a diameter (or width or other lateral dimension) of at least approximately 35 mm, or even at least approximately 50 mm. In various embodiments, the seed crystal 235 has a diameter (or width or other lateral dimension) of approximately 150 mm or less, and single-crystal AlN grown therefrom has a diameter (or width or other lateral dimension) of approximately 150 mm or less. In various embodiments, the crystalline orientation of the seed crystal 235 is substantially parallel to the c-axis. In other embodiments, the crystalline orientation of the seed crystal 235 is at least approximately 5°, or even at least approximately 10° away from the c-axis; the orientation of the seed crystal 235 may be toward a non-polar direction.

The crucible 205 may include, consist essentially of, or consist of one or more refractory materials, such as tungsten, rhenium, and/or tantalum nitride. As described in the '135 patent and the '153 patent, the crucible 205 may have one or more surfaces (e.g., walls) configured to selectively permit the diffusion of nitrogen therethrough and selectively prevent the diffusion of aluminum therethrough.

In accordance with embodiments of the invention, one or more internal parts of the crystal-growth apparatus 200 (e.g., the crucible 205, the susceptor 215, and/or the crucible stand 210) may be annealed before crystal growth and formation of AlN boule 220, and such annealing may advantageously decrease the carbon concentration (and/or the oxygen concentration) in the AlN boule 220. In various embodiments, the one or more internal parts of the crystal-growth apparatus 200 may be annealed at, for example, a temperature ranging from approximately 1000° C. to approximately 1800° C. for a time period of approximately 5 hours to approximately 50 hours.

In various embodiments of the invention, the concentration of oxygen and/or carbon within the AlN boule 220 may be decreased via the introduction of one or more gettering materials within the crucible 205 prior to and during growth of the AlN boule 220. The gettering materials may be introduced as a portion or all of one or more of the components of the crystal-growth apparatus 200 (e.g., the crucible 205, a liner situated within the crucible 205 and proximate an interior surface or wall thereof, the susceptor 215, and/or the crucible stand 210), and/or the gettering materials may be introduced as discrete masses of material within the crystal-growth apparatus 200. The gettering materials may be disposed between the source material 230 and the growing AlN boule 220 (but not, in various embodiments, in the direct line-of-sight therebetween or blocking the entire direct line-of-sight therebetween) in order to, e.g., getter or absorb contaminants such as carbon and/or oxygen from the vapor flowing toward the AlN boule 220 (i.e., toward the seed crystal 235). In various embodiments, the gettering materials are stable at and have melting points greater than the growth temperature (e.g., greater than approximately 2000° C.) and have low vapor pressures to prevent contamination of the growing AlN boule 220 with the gettering materials themselves. In various embodiments, a gettering material has a eutectic melting point with AlN that is greater than the growth temperature (e.g., greater than approximately 2000° C.). Examples of gettering materials in accordance with embodiments of the present invention include boron (melting point of approximately 2300° C.), iridium (melting point of approximately 2410° C.), niobium (melting point of approximately 2468° C.), molybdenum (melting point of approximately 2617° C.), tantalum (melting point of approximately 2996° C.), rhenium (melting point of approximately 3180° C.), and/or tungsten (melting point of approximately 3410° C.). In various embodiments, the gettering material (or the component of the apparatus 200 or portion thereof) may include, consist essentially of, or consist of one or more non-tungsten materials having melting temperatures of at least approximately 2300° C.

As shown in FIG. 2, during formation of the AlN boule 220, a polycrystalline material 240 may form at one or more locations within the crucible 205 not covered by the seed crystal 235. However, the diameter (or other radial dimension) of the AlN boule 220 may expand, i.e., increase, during formation of the AlN boule 220, thereby occluding the regions of polycrystalline material 240 from impinging vapor 225 and substantially limiting or even eliminating their growth. As shown in FIG. 2, the diameter of the AlN boule 220 may expand to (or even start out at, in embodiments utilizing larger seed crystals 235) be substantially equal to the inner diameter of the crucible 205 (in which case no further lateral expansion of the AlN boule 220 may occur).

The growth of the AlN boule 220 along a growth direction 245 typically proceeds due to a relatively large axial thermal gradient (e.g., ranging from approximately 5° C./cm to approximately 100° C./cm) formed within the crucible 205. A heating apparatus (not shown in FIG. 2 for clarity), e.g., an RF heater, one or more heating coils, and/or other heating elements or furnaces, heats the susceptor 215 (and hence the crucible 205) to an elevated temperature typically ranging between approximately 1800° C. and approximately 2300° C. Prior to the onset of growth, the crucible 205 and its contents (i.e., seed crystal 235, if present, and source material 230) may be held at a temperature approximately equal to the desired growth temperature for a predetermined soak time (e.g., between approximately 1 hour and approximately 10 hours). In various embodiments, this soak at temperature stabilizes the thermal field within the crucible 205, promotes effective nucleation on the seed crystal 235, and promotes high-quality transition from nucleation to bulk growth of the single-crystalline AlN.

The apparatus 200 may feature one or more sets of top thermal shields 250, and/or one or more sets of bottom axial thermal shields 255, arranged to create the large axial thermal gradient (by, e.g., better insulating the bottom end of crucible 205 and the source material 230 from heat loss than the top end of crucible 205 and the growing AlN boule 220). During the growth process, the susceptor 215 (and hence the crucible 205) may be translated within the heating zone created by the heating apparatus via a drive mechanism 260 in order to maintain the axial thermal gradient near the surface of the growing AlN boule 220. One or more pyrometers 265 (or other characterization devices and/or sensors) may be utilized to monitor the temperature at one or more locations within susceptor 215. The top thermal shields 250 and/or the bottom thermal shields 255 may include, consist essentially of, or consist of one or more refractory materials (e.g., tungsten), and may be quite thin (e.g., between approximately 0.125 mm and 0.5 mm thick). As detailed in the '612 patent, the top thermal shields 250 and/or the bottom thermal shields 255 may be arranged in various configurations and/or have various characteristics (i.e., different numbers of shields, different spacings between shields, different thicknesses, different sized apertures defined therethrough, different sizes, etc.) in order to form a variety of different axial and radial thermal gradients within the crucible 205 and thus, the growth of the AlN boule 220 (e.g., the growth rate, the degree of radial expansion during growth, if any, etc.).

The maximum mass transfer from source material 230 and/or vapor 225 (and therefore growth rate of AlN boule 220) is typically achieved by maximizing the axial thermal gradient within the crucible 205 (i.e., maximizing the temperature difference between the source material 230 and the growing crystal 220 so that the growing crystal 220 has greater supersaturation). In various embodiments, the onset of crystal-quality deterioration (e.g., increased dislocation density, formation of grain boundaries, and/or polycrystalline growth) sets the approximate upper limit of the supersaturation at a given growth temperature. For typical growth temperatures (e.g., between approximately 2125° C. and approximately 2275° C.), this upper limit of the axial temperature gradient is generally approximately 100° C./cm (although this maximum may depend at least in part on the dimensions and/or shape of the growth chamber, and may thus be larger for some systems). However, as the cross-sectional area of the AlN boule 220 increases (and/or for larger-area seed crystals 235), the probability of parasitic nucleation (on the seed crystal 235 or in other locations) increases. Each parasitic nucleation event may lead to formation of an additional growth center and result in grain or sub-grain formation (and thus low-quality and/or polycrystalline material). Minimizing the probability of parasitic nucleation is preferably achieved by providing a non-zero radial thermal gradient in a direction substantially perpendicular to the growth direction 245 that promotes lateral growth. Formation of the radial thermal gradient also enables growth of larger, high-quality crystals at high growth rates.

In various embodiments, the crucible 205 has a lid 270 with sufficient radiation transparency to enable at least partial control of the thermal profile within the crucible 205 via the arrangement of the top thermal shields 250. Furthermore, in embodiments featuring a seed crystal 235, the seed crystal 235 is typically mounted on the lid 270 prior to the growth of AlN boule 220. The lid 270 is typically mechanically stable at the growth temperature (e.g., up to approximately 2300° C.) and may substantially prevent diffusion of Al-containing vapor therethrough. Lid 270 generally includes, consists essentially of, or consists of one or more refractory materials (e.g., tungsten, rhenium, and/or tantalum nitride), and may be fairly thin (e.g., less than approximately 0.5 mm thick).

As shown in FIG. 2, each of the top thermal shields typically has an opening 275 therethrough. The opening 275 normally echoes the geometry and/or symmetry of the crucible 205 (e.g., the opening 275 may be substantially circular for a cylindrical crucible 205). The size of each opening 275 may be varied; typically, the size(s) range from a minimum of 10 mm to a maximum of approximately 5 mm (or even 2 mm) less than the diameter of the crucible 205.

For example, in an embodiment, five thermal shields 250, each having a diameter of 68.5 mm and an opening size (diameter) of 45 mm, are used. The thickness of each of the thermal shields 250 is 0.125 mm, and the thermal shields 250 are spaced approximately 7 mm from each other. At a typical growth temperature of 2065° C., this shield arrangement results in a radial thermal gradient (measured from the center of the semiconductor crystal to the inner edge of the crucible) of 27° C./cm.

As shown in FIG. 2, the top thermal shields 250 may have openings 275 larger than any such opening present in the bottom thermal shields 255, and/or the top thermal shields 250 may be stacked with one or more spacings between shields that are larger than that between the various bottom thermal shields 255. The spacings may range between approximately 1 mm and approximately 20 mm, or even between approximately 7 mm and approximately 20 mm. Also as shown, the openings 275 in the top thermal shields 250 may all be substantially equal to each other. Depending upon the desired growth conditions (e.g., pressure, temperature, crucible dimensions, distance between the seed crystal and the source material, etc.), the number of top thermal shields 250, the spacing between shields 250, and/or the size of the openings 275 may be varied to form the desired radial thermal gradient. The radial thermal gradient may even be varied in real time during the growth of AlN boule 220, e.g., in response to feedback based on determination of the radial thermal gradient during growth. For example, the radial thermal gradient may be determined based on the temperatures of lid 270 and one or more sides of crucible 215 (e.g., measured by pyrometers 265 as shown in FIG. 2).

Similarly, although each of the top thermal shields 250 may have a thickness less than 0.5 mm, the thickness of one or more of the shields 250 may be varied with respect to the others. For example, one or more top thermal shields 250 may have a thickness of approximately 0.25 mm while one or more others have a thickness of approximately 0.125 mm.

The thickness of the top thermal shields 250 may even be varied as a function of distance away from the lid 270 (i.e., either increasing or decreasing). Such thermal shields 250 having different thicknesses may be utilized to adjust the thermal field above and within the crucible 215. For example, a thicker shield may be used to block more radiative heat flow but will typically have higher thermal impact at temperatures where the heat flux is dominated by the thermal conductivity (lower temperatures, e.g. <1500°-1800°). Therefore, the resultant radial thermal gradient may vary as a function of growth temperature, even with the same arrangement of the same top thermal shields 250.

Figure 3:
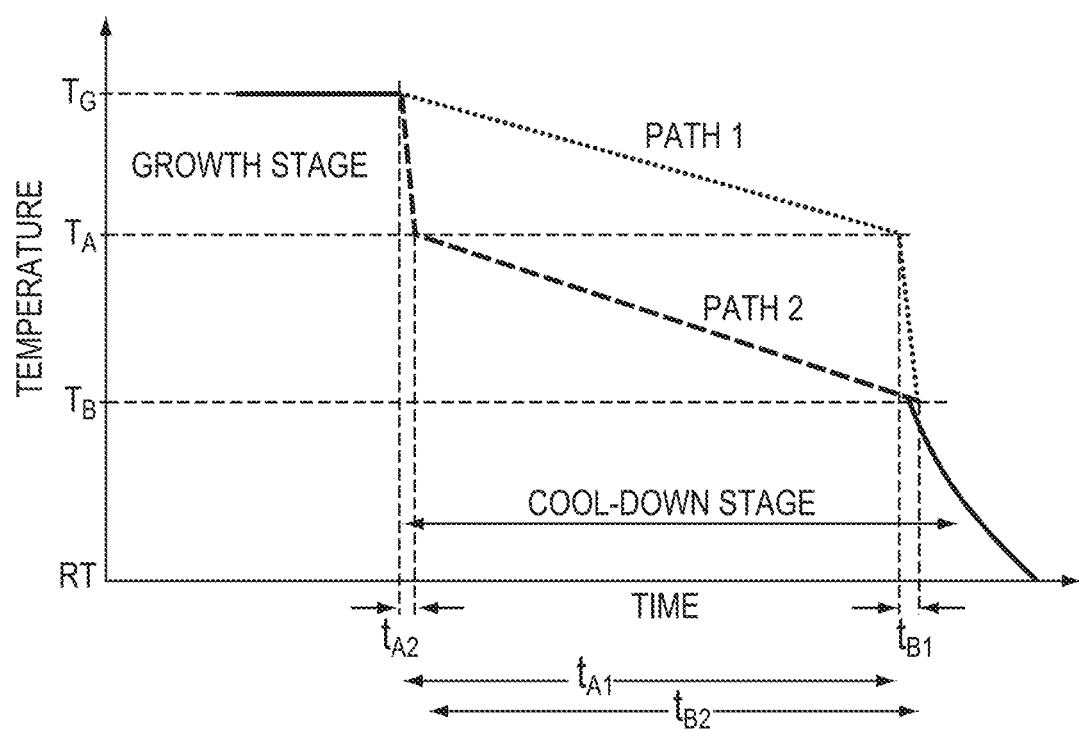
FIG. 3 is a graph of example cooling cycles for single-crystal AlN in accordance with various embodiments of the invention.

After growth of the AlN boule 220, controlled cooling techniques may be utilized to maintain, and even enhance in many embodiments, the UV transparency of the AlN boule 220 as it is cooled to room temperature. FIG. 3 schematically depicts two different cooling cycles that may be utilized in accordance with embodiments of the present invention. As shown, in a first embodiment ("Path 1"), the AlN boule 220 undergoes a slow-cooling stage followed by a fast-cooling stage. Specifically, the AlN boule 220 may be first cooled from the growth temperature to an intermediate temperature $T_A$ ranging from approximately 1450° C. to approximately 2150° C. over a time $t_{A1}$ ranging from approximately 10 minutes to approximately 90 minutes. After reaching temperature $T_A$, the AlN boule 220 may be cooled to a second intermediate temperature $T_B$ ranging from approximately 1000° C. to approximately 1650° C. over a time $t_{B1}$ ranging from approximately 10 seconds to approximately 10 minutes. After reaching temperature $T_B$, the AlN boule 220 may be left to cool to approximately room temperature (e.g., approximately 25° C.) at an uncontrolled rate, i.e., a rate depending only on the cooling rate of the growth system (i.e., the surroundings of AlN boule 220) without power applied to the heating elements thereof. At any point after cooling to temperature $T_B$, the AlN boule 220 and the crucible 205 may be removed from the growth system to cool in the surrounding ambient to approximately room temperature.

As also shown in FIG. 3, in a second embodiment ("Path 2"), the AlN boule 220 undergoes a fast-cooling stage followed by a slow-cooling stage. Specifically, the AlN boule 220 may be first cooled from the growth temperature to the intermediate temperature $T_A$ over a time $t_{A2}$ ranging from approximately 10 seconds to approximately 10 minutes. After reaching temperature $T_A$, the AlN boule 220 may be cooled to the second intermediate temperature $T_B$ over a time $t_{B2}$ ranging from approximately 10 minutes to approximately 90 minutes. After reaching temperature $T_B$, the AlN boule 220 may be left to cool to approximately room temperature (e.g., approximately 25° C.) at an uncontrolled rate, i.e., a rate depending only on the cooling rate of the growth system (i.e., the surroundings of AlN boule 220) without power applied to the heating elements thereof. At any point after cooling to temperature $T_B$, the AlN boule 220 and the crucible 205 may be removed from the growth system to cool in the surrounding ambient to approximately room temperature.

During the cooling of the AlN boule 220 to intermediate temperatures $T_A$ and $T_B$, the temperature of the growth system surrounding the crucible 205 may be controlled to obtain the desired temperature changes over the desired times. For example, the power supplied to heating elements (e.g., RF coil) may be decreased over a desired time to adjust the resulting temperature of the AlN boule 220, and/or the temperature may be directly controlled via feedback enabled by temperature measurements from, e.g., pyrometers or other temperature sensors in the growth system. While the temperature changes along Paths 1 and 2 in FIG. 3 are depicted as linear, in various embodiments these changes may have an exponential dependence, particularly in embodiments in which a power-controlled cool-down is applied.

In various embodiments, the choice between Paths 1 and 2 may be made depending on various parameters of the growth apparatus. For example, in a setup in which the AlN boule 220 is strongly bonded to its surroundings (e.g., lid 270, crucible 205, etc.), there may be a higher probability of stress resulting from thermal-expansion mismatch between the AlN boule 220 and those surroundings, which may result in cracking and/or an increased dislocation density in AlN boule 220. Such strong bonding may result from large thermal gradients (e.g., axial and/or lateral) within the crucible 205, and the bond strength may increase as those thermal gradients increase. In such cases, Path 2 may be preferred. In embodiments in which the AlN boule 220 is only loosely bonded to its surroundings, and/or in which the thermal-expansion coefficients of the AlN boule 220 and the crucible 205 are similar, Path 1 may be selected. Moreover, the present inventors have cooled AlN boules 220 via both Paths 1 and 2, and the UV absorption coefficients of the resulting crystals are generally lower than in similarly grown crystals that are cooled down from the growth temperature to a temperature of approximately 1000° C. in a single rapid step (e.g., over approximately 10 minutes).

In various embodiments, the two-stage cooling cycles described above (i.e., Paths 1 and 2) may be replaced with a single-stage cooling cycle that maintains, and even enhances in many embodiments, the UV transparency of the AlN boule 220 as it is cooled to room temperature. In single-stage cooling cycles in accordance with embodiments of the invention, the fast-cooling stage of either Path 1 or 2 may be eliminated (i.e., have a time of approximately zero), and the AlN boule 220 may be first cooled from the growth temperature to the intermediate temperature $T_B$ ranging from approximately 1000° C. to approximately 1650° C. over a time period ranging from approximately 1 hour to approximately 10 hours. After reaching temperature $T_B$, the AlN boule 220 may be left to cool to approximately room temperature (e.g., approximately 25° C.) at an uncontrolled rate, i.e., a rate depending only on the cooling rate of the growth system (i.e., the surroundings of AlN boule 220) without power applied to the heating elements thereof. At any point after cooling to temperature $T_B$, the AlN boule 220 and the crucible 205 may be removed from the growth system to cool in the surrounding ambient to approximately room temperature.

In various embodiments of the present invention, the two-stage or single-stage cool-down cycles described in reference to FIG. 3 may be utilized after an annealing cycle to enhance UV transparency of previously grown AlN bulk crystals (e.g., boules or substrates separated therefrom). For example, in various embodiments, an AlN bulk crystal (grown in accordance with embodiments of the present invention or via other techniques) may be annealed at a temperature exceeding 2000° C., e.g., ranging from approximately 2000° C. to approximately 2400° C. Thereafter, the AlN bulk crystal may be cooled down to room temperature via Path 1 or Path 2 as detailed above, or via the single-stage cooling cycle detailed above. The use of such an annealing and cool-down cycle may advantageously increase the UV transparency (e.g., decrease the UV absorption coefficient for one or more wavelengths) of the AlN bulk crystal.

After formation of AlN boule 220, one or more substrates (or "wafers") may be separated from AlN boule 220 by the use of, e.g., a diamond annular saw or a wire saw. In an embodiment, a crystalline orientation of a substrate thus formed may be within approximately 2° (or even within approximately 1°, or within approximately 0.5°) of the (0001) face (i.e., the c-face). Such c-face wafers may have an Al-polarity surface or an N-polarity surface, and may subsequently be prepared as described in U.S. Pat. No. 7,037,838, the entire disclosure of which is hereby incorporated by reference. In other embodiments, the substrate may be oriented within approximately 2° of an m-face or a-face orientation (thus having a non-polar orientation) or may have a semi-polar orientation if AlN boule 220 is cut along a different direction. The surfaces of these wafers may also be prepared as described in U.S. Pat. No. 7,037,838. The substrate may have a roughly circular cross-sectional area with a diameter of greater than approximately 50 mm. The substrate may have a thickness that is greater than approximately 100 µm, greater than approximately 200 µm, or even greater than approximately 2 mm. The substrate typically has the properties of AlN boule 220, as described herein. After the substrate has been cut from the AlN boule 220, one or more epitaxial semiconductor layers and/or one or more light-emitting devices, e.g., UV-emitting light-emitting diodes or lasers, may be fabricated over the substrate, for example as described in U.S. Pat. Nos. 8,080,833 and 9,437,430, the entire disclosure of each of which is hereby incorporated by reference.

Figure 4A:
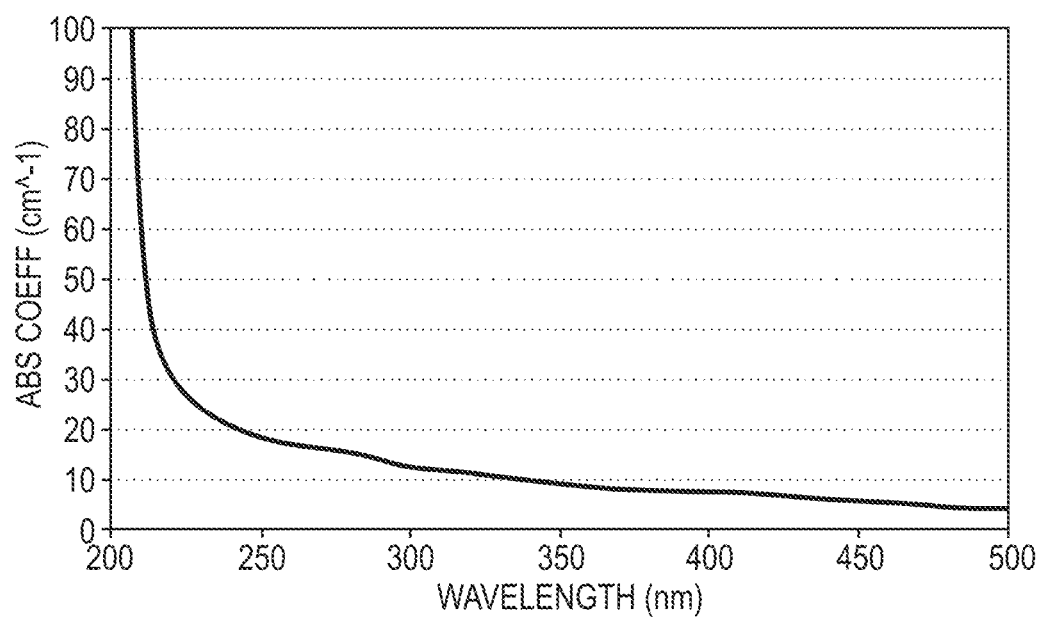
FIG. 4A is graph of UV absorption coefficient, as a function of wavelength, for single-crystal AlN grown in accordance with various embodiments of the invention.
Figure 4B:
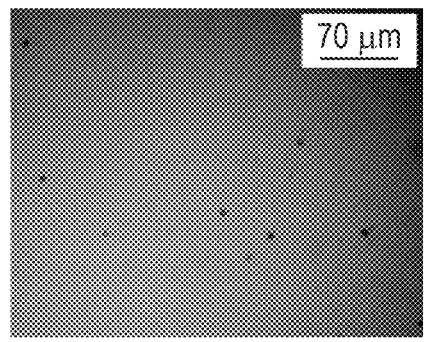
FIG. 4B is a micrograph of an etch pit density measurement of single-crystal AlN grown in accordance with various embodiments of the invention.
Figure 4C:
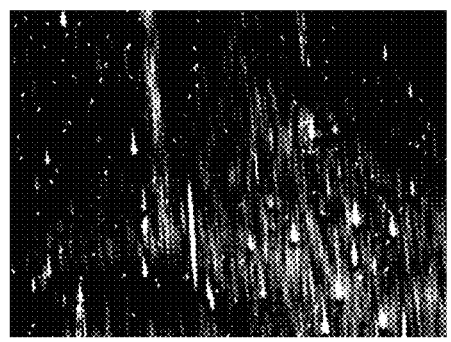
FIG. 4C is an x-ray topography map of single-crystal AlN grown in accordance with various embodiments of the invention.
Figure 4D:
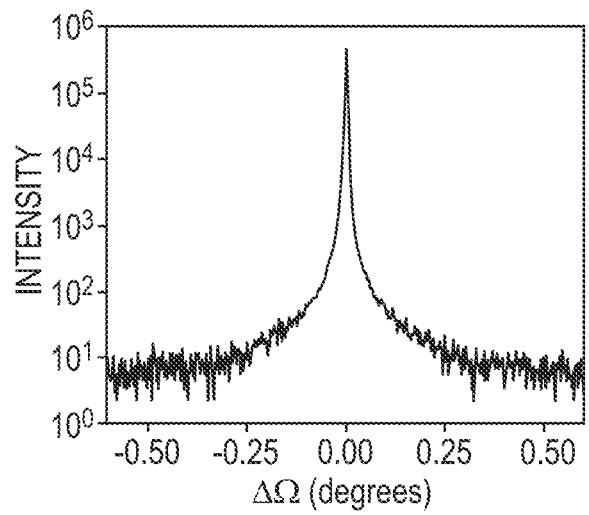
FIGS. 4D and 4E are x-ray rocking curves of single-crystal AlN grown in accordance with various embodiments of the invention.
Figure 4E:
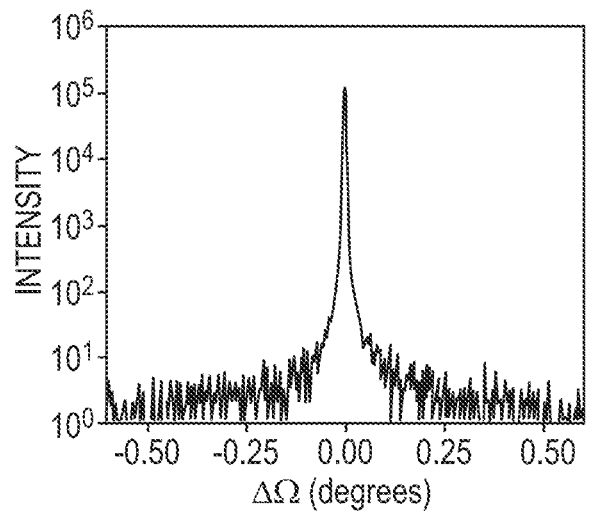

FIGS. 4A-4E depict various characteristics of crack-free AlN bulk crystals having diameters of approximately 50 mm produced in accordance with embodiments of the present invention. As shown in FIG. 4A, such crystals have high UV transparencies, e.g., UV absorption coefficients of less than 30 $cm^{-1}$ for the UV wavelengths of approximately 220 nm to approximately 480 nm, and less than 20 $cm^{-1}$ for wavelengths of approximately 250 nm to approximately 480 nm. FIG. 4B is a micrograph of an etch pit density measurement (i.e., an etching measurement that reveals defects such as threading dislocations intersecting the surface of the crystal) of approximately $7 \times 10^3$ $cm^{-2}$. FIG. 4C is an x-ray topography map of an AlN crystal grown in accordance with embodiments of the invention revealing a density of threading edge dislocations of approximately $3 \times 10^3$ $cm^{-2}$ and a density of threading screw dislocations of approximately 10 $cm^{-2}$, i.e., a total threading dislocation density less than approximately $10^4$ $cm^{-2}$. FIGS. 4D and 4E depict x-ray rocking curves (along (0002) and (10-12) respectively) having full width at half maximum (FWHM) values less than 50 arcsec. As measured by secondary ion mass spectroscopy (SIMS), the samples depicted in FIGS. 4A-4E had carbon concentrations less than $3 \times 10^{17}$ $cm^{-3}$-$4 \times 10^{17}$ $cm^{-3}$, oxygen concentrations less than $1 \times 10^{17}$ $cm^{-3}$-$4 \times 10^{17}$ $cm^{-3}$, silicon concentrations less than $1 \times 10^{17}$ $cm^{-3}$, and ratios of carbon to oxygen concentration of less than 0.5.

In various embodiments of the invention, oxygen may be intentionally added to the AlN crystal during and/or after growth in order to maintain the ratio of carbon to oxygen concentration in the AlN crystal at a level of less than 0.5. As detailed herein, various measures may be taken to minimize the carbon concentration within the AlN crystal (e.g., to a level of approximately $3 \times 10^{17}$ $cm^{-3}$ or less), and thus, in the absence of additional oxygen, the ratio of carbon to oxygen within the crystal may be greater than 0.5. Thus, oxygen gas may be introduced into the growth crucible during at least a portion of the growth of the AlN crystal, and/or the AlN crystal may be annealed in an oxygen-containing ambient after growth. In various embodiments, the polycrystalline AlN source material may be exposed to oxygen (e.g., within an elevated-temperature anneal cycle), and the oxygen thus absorbed into the source material may be released into the vapor phase during growth. While the present inventors do not wish to be bound by any particular theory of operation of such additional oxygen, the introduction of additional oxygen in the AlN crystal may have one or more beneficial effects resulting in increased UV transparency. For example, the oxygen may react with any carbon within the vapor phase to form CO and/or $CO_2$, as carbon has a low vapor pressure and is typically mainly transported by attaching itself to another species or being flushed toward the crystal due to a high flux of vapor. The additional oxygen may also create point defects (e.g., vacancies and/or complexes) within the AlN crystal that reduce the UV light absorption centers resulting from carbon impurities (e.g., via vacancy annihilation).

Figure 4F:
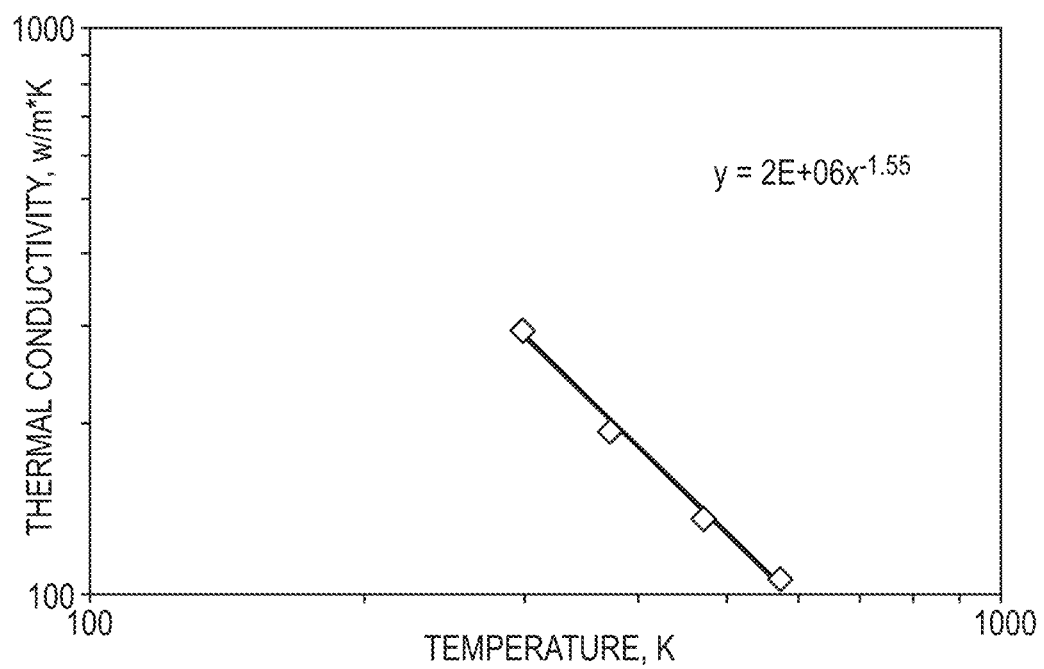
FIG. 4F is a graph of thermal conductivity of single-crystal AlN grown in accordance with various embodiments of the invention.

In various embodiments, as measured by SIMS, AlN single crystals having diameters of at least 50 mm may have carbon concentrations of approximately $0.6 \times 10^{17}$ $cm^{-3}$-$6.2 \times 10^{17}$ $cm^{-3}$, as well as oxygen concentrations of approximately $1 \times 10^{17}$ $cm^{-3}$-$7.9 \times 10^{17}$ $cm^{-3}$. The thermal conductivity of AlN boule 220 and/or substrates derived therefrom may be greater than approximately 290 Watts per meter-Kelvin (W/m·K), as measured by the American Society for Testing and Materials (ASTM) Standard E1461-13 (Standard Test Method for Thermal Diffusivity by the Flash Method), the entire disclosure of which is incorporated by reference herein, and provided by a commercial vendor such as NETZSCH Inc. of Exton, Pa. As shown in FIG. 4F, the thermal conductivity of a crack-free AlN bulk crystal having a diameter of approximately 50 mm produced in accordance with embodiments of the present invention was approximately 293 W/m·K with a slope of −1.55. In this sample, the oxygen and carbon concentration were confirmed by SIMS as $3.5 \times 10^{17}$ $cm^{-3}$ and $1.2 \times 10^{17}$ $cm^{-3}$, respectively.

Figure 5A:
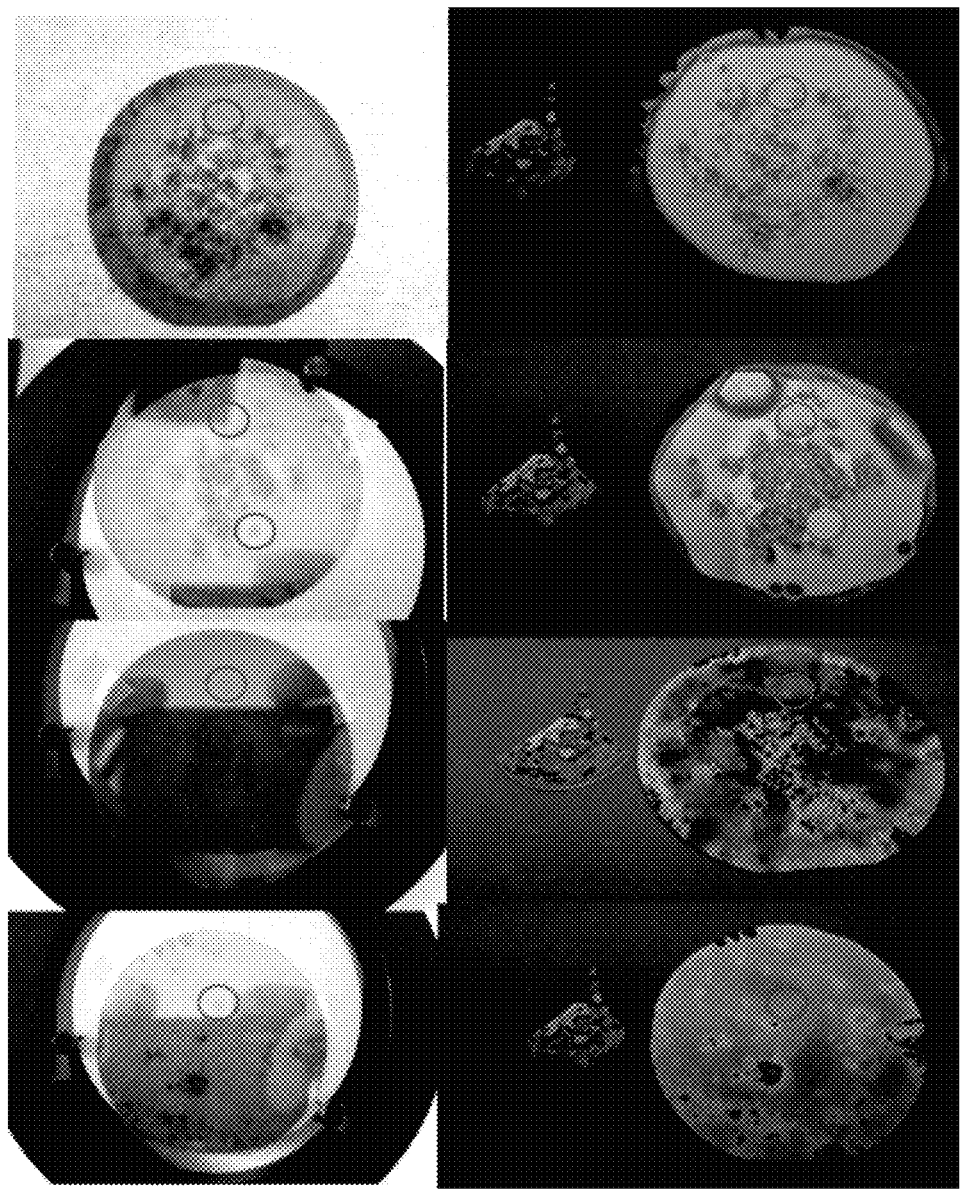
FIG. 5A is a series of micrographs of various single-crystal AlN wafers, grown in accordance with various embodiments of the invention; for each wafer, a view under normal illumination and a view of PL luminescence are shown.

The present inventors have also found that there is a strong correlation between the visible photoluminescence (PL) color and the carbon concentration in single-crystal AlN produced in accordance with embodiments of the present invention. Specifically, in various embodiments, an AlN single crystal may be illuminated with a mercury light source having a wavelength of 254 nm. The resulting luminescence may be observed with the naked eye or captured with an imaging device such as a digital camera. If the resulting luminescence is bright blue, it corresponds to high carbon concentration and high resulting UV absorption, whereas dark blue, black, or dark green luminescence corresponds to low carbon concentration. FIG. 5A is a series of micrographs of various single-crystal AlN wafers illuminated under normal lighting conditions, as well as the PL luminescence of the samples when illuminated as described above. Areas on the substrates that exhibited bright blue luminescence were also found to have high levels of carbon and corresponding high levels of UV absorption, particularly at wavelengths near 265 nm. The corresponding impurity concentrations in the sampled areas (indicated by the small circles), as well as the UV absorption coefficients at 265 nm, for the samples of FIG. 5A are shown in the table of FIG. 5B, where sample (1) corresponds to the top sample of FIG. 5A, and the sample numbers increase downward in numerical order. As shown in FIGS. 5A and 5B, not only does the PL luminescence correlate well to UV absorption and impurity concentration, but the UV absorption coefficient itself correlates well with carbon concentration and the ratio of carbon to oxygen in the samples.

Figure 6A:
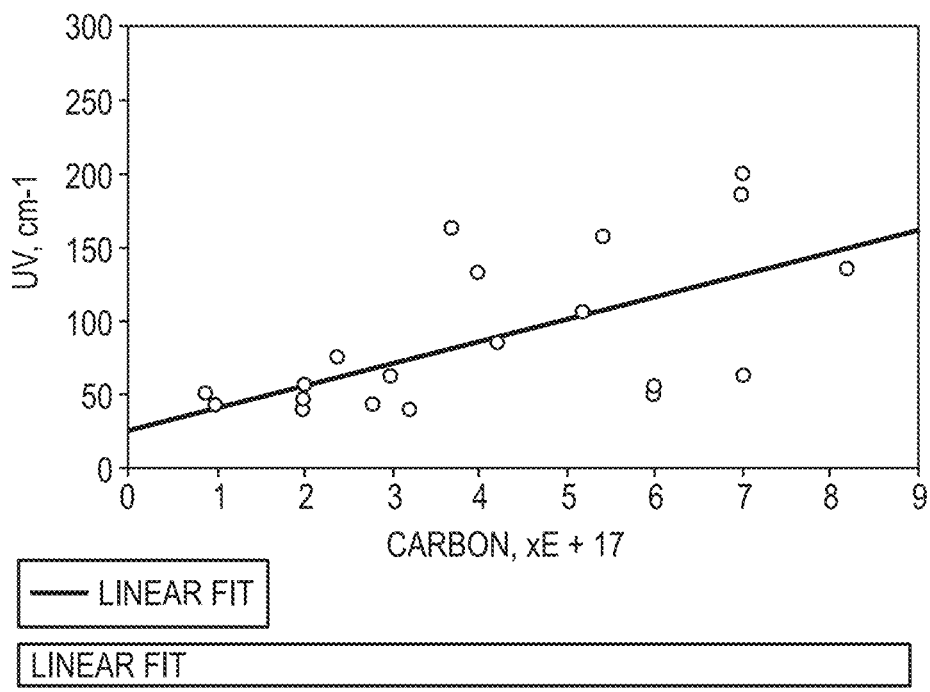
FIGS. 6A and 6B are graphs showing the relationship between C concentration and C-to-O ratio with UV absorption coefficient of single-crystal AlN wafers grown in accordance with various embodiments of the invention.
Figure 6B:
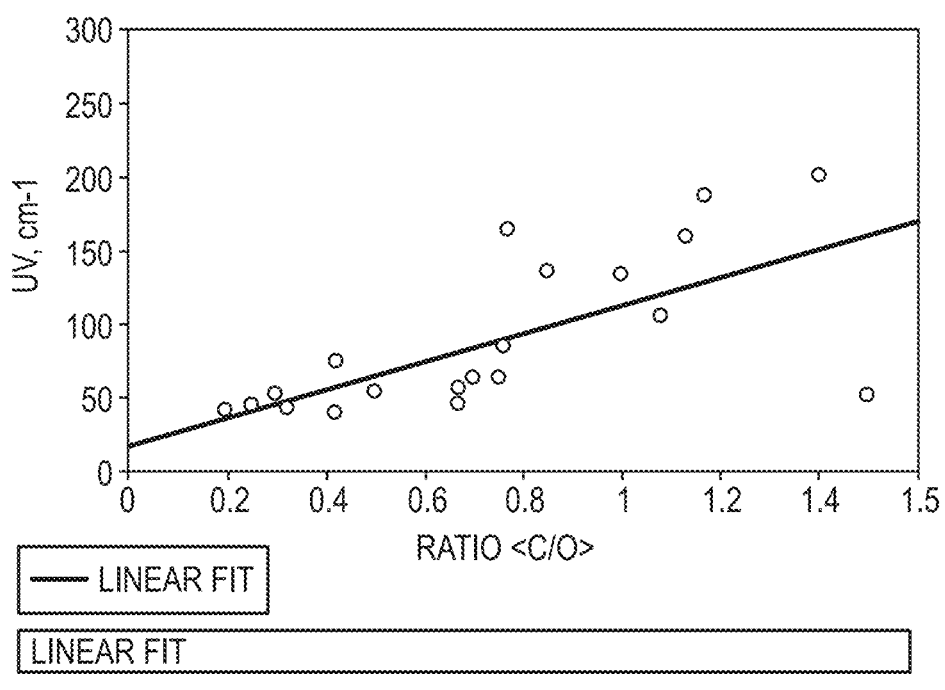

FIGS. 6A and 6B illustrate the relationship between UV absorption coefficient for 50 mm-diameter AlN single crystals at a wavelength of 265 nm and the carbon concentration (FIG. 6A) and the ratio of carbon concentration to oxygen concentration (FIG. 6B) measured via SIMS. As shown, the UV absorption coefficient is quite strongly related to both the carbon concentration and the carbon-to-oxygen ratio, and that embodiments of the invention having UV absorption coefficients of less than 50 cm$^{-1}$ have carbon concentrations less than about $3 \times 10^{17}$ cm$^{-3}$ and carbon-to-oxygen concentration ratios of less than about 0.5.

AlN bulk crystals produced in accordance with embodiments of the present invention advantageously exhibit large ultraviolet (UV) transparency metrics, where the UV transparency metric is defined in cm$^3$ as:

$$\frac{d}{10 \times FWHM \times \alpha^2}$$

where d is the diameter of the AlN crystal in mm, FWHM is the full-width at half-maximum of an x-ray rocking curve of the AlN crystal in radians, and α is the absorption coefficient of the AlN crystal at the wavelength of interest. For example, AlN bulk crystals may have UV transparency metrics ranging from approximately 5 cm$^3$ to approximately 5000 cm$^3$ at a wavelength of 265 nm, or even ranging from approximately 30 cm$^3$ to approximately 5000 cm$^3$ at a wavelength of 265 nm. Such AlN crystals may have diameters (or widths or other lateral dimensions) of at least approximately 50 mm. The table below depicts various UV transparency metrics as a function of crystal diameter, FWHM, and absorption coefficient.

| Crystal Diameter (inch) | FWHM (arcsec) | Abs. Coeff. (cm$^{-1}$) | UV Trans. Metric (cm$^3$) |
| --- | --- | --- | --- |
| 1 | 50 | 45 | 5 |
| 1 | 25 | 30 | 23 |
| 1 | 10 | 1 | 52393 |
| 2 | 300 | 80 | 1 |
| 2 | 50 | 45 | 10 |
| 2 | 35 | 45 | 15 |
| 2 | 50 | 30 | 23 |
| 2 | 35 | 30 | 33 |
| 2 | 50 | 5 | 838 |
| 2 | 10 | 5 | 4191 |
| 2 | 10 | 1 | 104785 |

The table below depicts ranges of the UV transparency metric for AlN single crystals produced in accordance with embodiments of the invention and having FWHM of 25 arcsec as a function of wavelength and diameters of at least 50 mm.

| Wavelength (nm) | UV Trans. Metric (cm$^3$) |
| --- | --- |
| 210 | 1-11 |
| 220 | 5-47 |
| 230 | 5-95 |
| 240 | 5-116 |
| 250 | 5-129 |
| 255 | 5-145 |
| 265 | 5-186 |
| 280 | 10-186 |
| 310 | 10-291 |
| 350 | 20-517 |
| 410 | 20-855 |
| 450 | 50-1677 |
| 500 | 50-2620 |

Figure 7:
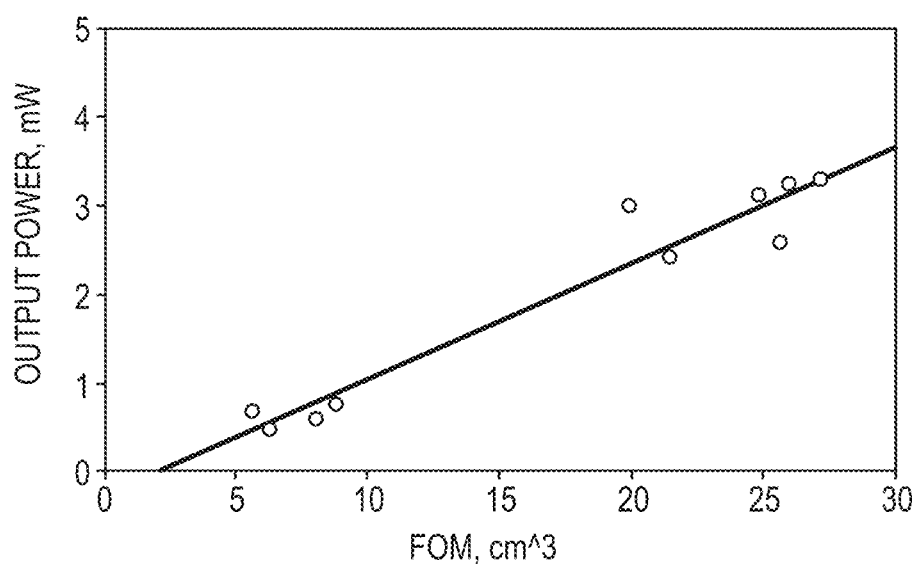
FIG. 7 is a graph of UV LED output power as a function of UV transparency metric of the LED substrate in accordance with various embodiments of the invention.

In accordance with embodiments of the present invention, the output power of UV-emitting light-emitting devices such as LEDs is advantageously increased as the UV transparency metric of the underlying substrate increases. In an example, six AlN single-crystal substrates were cut from a boule produced as described herein but without the controlled cool-down cycle detailed above with respect to FIG. 3. Six additional AlN single-crystal substrates were cut from a boule produced similarly but with the controlled cool-down cycle. All substrates had diameters of approximately 50 mm. UV LEDs emitting at 265 nm were fabricated on all 12 substrates, and the device power from the devices at an operating power of 100 mA was measured without any thinning or removal of the underlying AlN substrate. The UV absorption of each substrate was measured for the wavelength of 265 nm and averaged over 52 different locations over each substrate. The FWHM of the x-ray rocking curves for each substrate was the average of 13 different measurements each at a different location. FIG. 7 is a graph of the output power as a function of the UV transparency metric and, as shown, the output power exhibits a strong dependence on the UV transparency metric. Thus, the UV transparency metric as defined herein provides a suitable tool for estimation of light-emitting device performance for devices ultimately fabricated on AlN single-crystal substrates produced in accordance with embodiments of the present invention.

Single-crystal AlN, and wafers formed therefrom, may be utilized for fabrication of electronic and optoelectronic devices thereon. For example, portions of AlN single crystals grown in accordance with embodiments of the invention detailed herein may be utilized as substrates for subsequent epitaxial growth and processing for the formation of LEDs and/or lasers that emit light in the ultraviolet wavelength range.

Figure 8A:
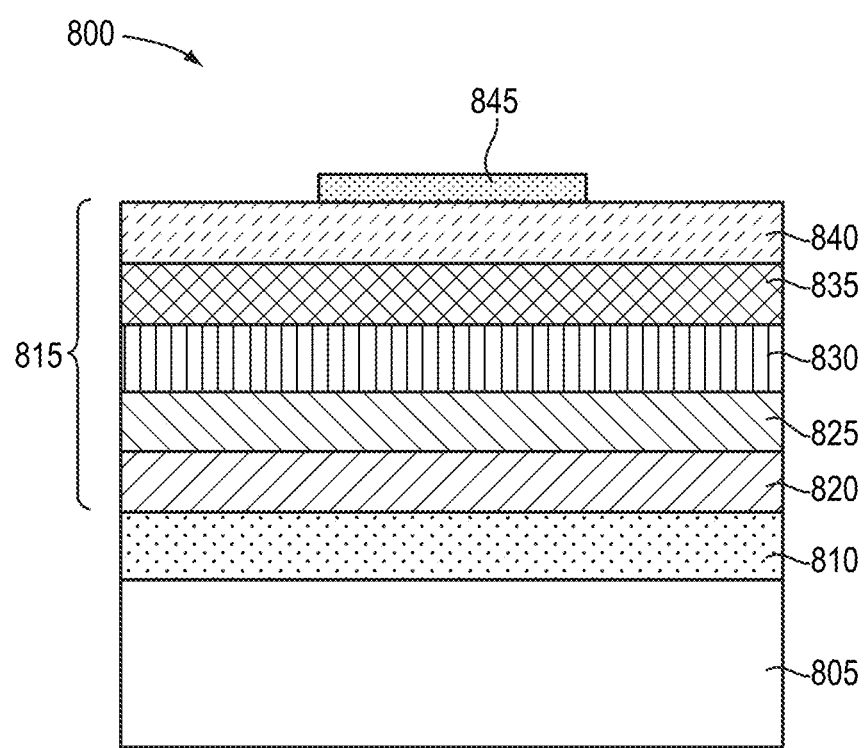
FIGS. 8A and 8B are schematic cross-sections of light-emitting devices in accordance with various embodiments of the invention.

FIG. 8A schematically depicts a light-emitting device structure 800 in accordance with embodiments of the present invention. Light-emitting device structures 800 in accordance with embodiments of the invention may include, consist essentially of, or consist of, for example, light-emitting diodes or lasers. As shown, the device structure 800 includes a substrate 805, which in various embodiments includes, consists essentially of, or consists of aluminum nitride, e.g., single-crystal aluminum nitride. In various embodiments, substrate 805 is a single-crystal substrate separated from single-crystalline AlN grown in accordance with embodiments of the invention after formation thereof. In various embodiments, the substrate 805 may not be transparent (at least not fully transparent) to radiation emitted by the device structure 800 (e.g., UV radiation), depending upon the wavelength(s) emitted by device structure 800. Substrate 805 may be miscut such that the angle between its c-axis and its surface normal is between approximately 0° and approximately 4°. In various embodiments, the misorientation of the surface of substrate 805 is less than approximately 0.3°, e.g., for substrates 805 that are not deliberately or controllably miscut. In other embodiments, the misorientation of the surface of substrate 805 is greater than approximately 0.3°, e.g., for substrates 805 that are deliberately and controllably miscut. In various embodiments, the direction of the miscut is towards the a-axis.

The surface of substrate 805 may have a group-III (e.g., Al—) polarity, and may be planarized, e.g., by chemical-mechanical polishing. The RMS surface roughness of substrate 805 may be less than approximately 0.5 nm for a 10 μm×10 μm area. In some embodiments, atomic-level steps are detectable on the surface when probed with an atomic-force microscope. The threading dislocation density of substrate 805 may be measured using, e.g., etch pit density measurements after a 5 minute KOH—NaOH eutectic etch at 450° C. In various embodiments, the threading dislocation density is less than approximately $2 \times 10^3$ cm'. In some embodiments substrate 805 has an even lower threading dislocation density. Substrate 805 may be topped with a homoepitaxial layer (not shown) that may include, consist essentially of, or consist of doped or undoped AlN.

The various layers of device structure 800 disposed over substrate 805 may be formed by any of a variety of different techniques, e.g., epitaxial growth techniques such as chemical vapor deposition (CVD) methods such as metalorganic CVD (MOCVD).

In accordance with embodiments of the invention, a release layer 810 may be disposed over the substrate 805 to facilitate later removal of all or a portion of the substrate 805 from the rest of device structure 800, for example as described in U.S. patent application Ser. No. 15/977,031, filed on May 11, 2018 (the '031 patent application), the entire disclosure of which is incorporated by reference herein. In various embodiments, the release layer 810 is substantially lattice-matched to the substrate 805. Minimizing the lattice mismatch between the release layer 810 and the substrate 805 advantageously reduces or eliminates, for example, cracking and/or defect introduction in the release layer 810 and island formation (i.e., three-dimensional growth) during growth of the release layer 810. (As used herein, a layer that is "substantially lattice-matched" to a substrate or another layer has an unstrained lattice parameter sufficiently close to that of the substrate or other layer to enable epitaxial growth of the layer thereover such that the layer is approximately lattice-relaxed, or tensilely or compressively strained without significant strain relaxation (e.g., less than 20% relaxation, or even less than 10% relaxation), and/or to enable epitaxial growth of the layer without introduction of cracks and/or defects (e.g., dislocations) at densities exceeding those, if any, present in the underlying substrate or layer.) In various embodiments, the lattice mismatch between the release layer 810 and the substrate 805 is less than ±5%, less than ±3%, less than ±2%, less than ±1%, less than ±0.5%, less than ±0.2%, or less than ±0.1%. In various embodiments, it may be preferable to reduce the lattice mismatch when the release layer 810 is tensilely strained (i.e., the unstrained, innate in-plane lattice spacing of the release layer 810 is smaller than that of substrate 805) in order to minimize or eliminate stress-relieving cracking in the release layer 810. In various embodiments, when the release layer 810 is compressively strained, the lattice mismatch to the substrate 805 may be larger but may be a function of the thickness of release layer 810. For example, compressively strained release layers 810 having too much lattice mismatch to the substrate 805 and too large a thickness may island during layer growth. Thus, in various embodiments, a release layer 810 having a compressive lattice mismatch with substrate 805 of approximately 3% may have a thickness no more than approximately 10 nm. For layers with less lattice mismatch, the thickness may be larger.

In various embodiments, the release layer 810 includes, consists essentially of, or consists of AlN or AlGaN doped with one or more impurities that form an absorption band within the release layer 810 for a wavelength of light not strongly absorbed by the substrate 805 itself. For example, the release layer 810 may include, consist essentially of, or consist of AlN doped with oxygen, which has an absorption band at approximately 310 nm. Since an AlN substrate 805 does not strongly absorb light having wavelengths larger than approximately 300 nm, absorption of light within, and concomitant local heating of, the release layer 810 may be utilized to remove the substrate 805 from the device structure 800. In various embodiments, the release layer 810 may be doped with oxygen (O) and/or one or more other dopants, for example, carbon (C), iron (Fe), manganese (Mn), or gadolinium (Gd). Such dopants may be introduced (e.g., as an additional gaseous species) during epitaxial growth of the release layer 810. In other embodiments, some or all of the dopant may be introduced after epitaxial growth of at least a portion of the release layer 810 by techniques such as ion implantation or dopant diffusion (e.g., from a solid or gaseous source). In various embodiments of the invention, one or more of the dopants may be introduced into and/or present within the release layer 810 at a concentration of at least for example, approximately $10^{17}$ cm$^{-3}$, at least approximately $10^{18}$ cm$^{-3}$, or even at least $10^{19}$ cm$^{-3}$. In various embodiments of the invention, one or more of the dopants may be introduced into and/or present within the release layer 810 at a concentration of at most for example, approximately $10^{20}$ cm$^{-3}$, or at most approximately $10^{21}$ cm$^{-3}$.

In exemplary embodiments, a release layer 810 including, consisting essentially, or consisting of AlN doped with oxygen may exhibit an absorption band at a wavelength of approximately 310 nm, and a release layer 810 including, consisting essentially, or consisting of AlN doped with carbon may exhibit an absorption band at a wavelength of approximately 265 nm. In such embodiments, radiation for substrate separation may be applied via, for example, a KrF laser (emission wavelength of approximately 248 nm) or a XeCl laser (emission wavelength of approximately 308 nm).

In various embodiments, release layer 810 may include, consist essentially of, or consist of a semiconductor other than AlN (e.g., AlGaN), and which may contain one or more dopants forming one or more absorption bands for light that is not strongly absorbed by substrate 805. In various embodiments, the release layer 810 may include, consist essentially of, or consist of a nitride alloy containing one or more of boron, aluminum, gallium, and/or indium. The release layer 810 may even include, consist essentially of, or consist of silicon carbide or a metal nitride (in which the metal is, e.g., one or more of Sc, Y, La, Ti, or Ta). For example, a release layer 810 including, consisting essentially, or consisting of silicon carbide may exhibit an absorption band at a wavelength of approximately 376 nm, and a release layer 810 including, consisting essentially, or consisting of titanium nitride may exhibit an absorption band at a wavelength of approximately 365 nm. In various embodiments, the release layer 810 is substantially lattice-matched to substrate 805.

In various embodiments, multiple release layers 810 may be present within device structure 300, and each release layer 810 may have one or more absorption bands different from one or all absorption bands in the other release layer(s) 810. For example, multiple release layers 810 including, consisting essentially of, or consisting of AlN or AlGaN may be formed (e.g., epitaxially grown), where each release layer 810 is doped with a different one of the dopants referred to above. In various embodiments, one or more release layers 810 may be tensilely strained with respect to the substrate 805, and/or one or more release layers 810 may be compressively strained with respect to the substrate 805. In various embodiments of the invention, release layer 810 is not present within the device structure 800.

Device structure 800 also includes an active light-emitting structure 815 disposed over the release layer 810, if the release layer 810 is present, as shown in FIG. 8A. For example, the active structure 815 may include a bottom contact layer 820. In various embodiments, the bottom contact layer 820 is n-type doped, e.g., doped with an impurity such as P, As, Sb, C, H, F, O, Mg, and/or Si. The bottom contact layer 820 may include, consist essentially of, or consist of, for example, AlN or $Al_xGa_{1-x}N$. In an embodiment, an optional graded buffer layer (not shown) is disposed above substrate 805 and below bottom contact layer 820 (and, in various embodiments, below the release layer 810, if the release layer 810 is present). The graded buffer layer may include, consist essentially of, or consist of one or more semiconductor materials, e.g., $Al_xGa_{1-x}N$. In various embodiments, the graded buffer layer has a composition approximately equal to that of substrate 805 at the bottom interface of the graded buffer layer in order to promote two-dimensional growth and avoid deleterious islanding (such islanding may result in undesired elastic strain relief and/or surface roughening in the graded buffer layer and subsequently grown layers). The composition of the graded buffer layer at an interface with bottom contact layer 820 (or release layer 810, if present) may be chosen to be close to (e.g., approximately equal to) that of the desired active region of the device (e.g., the $Al_xGa_{1-x}N$ concentration that will result in the desired wavelength emission from the light-emitting device). In an embodiment, the graded buffer layer includes, consists essentially of, or consists of doped or undoped $Al_xGa_{1-x}N$ graded from an Al concentration x of approximately 100% to an Al concentration x ranging from approximately 60% to approximately 85%.

The bottom contact layer 820 may have a thickness sufficient to prevent current crowding after device fabrication and/or to stop on during etching to fabricate contacts. For example, the thickness of bottom contact layer 820 may range from approximately 100 nm to approximately 500 nm, or from approximately 100 nm to approximately 2 μm. When utilizing a bottom contact layer 820, the final light-emitting device may be fabricated with back-side contacts. In various embodiments, bottom contact layer 820 will have high electrical conductivity even with a small thickness due to the low defect density maintained when the layer is pseudomorphic. As utilized herein, a pseudomorphic film is one where the strain parallel to the interface between the film and an underlying layer or substrate is approximately that needed to distort the lattice in the film to match that of the substrate (or a relaxed, i.e., substantially unstrained, layer over the substrate and below the pseudomorphic film). Thus, the parallel strain in a pseudomorphic film will be nearly or approximately equal to the difference in lattice parameters between an unstrained substrate parallel to the interface and an unstrained epitaxial layer parallel to the interface.

Active structure 815 is configured for the emission of light in response to an applied voltage. Thus, the active structure 815 may include a multiple-quantum well ("MQW") layer 825 disposed above bottom contact layer 820. In various embodiments, MQW layer 825 is disposed directly on the bottom contact layer 820. In other embodiments, an optional layer (e.g., an undoped layer including, consisting essentially of, or consisting of an undoped semiconductor material such as AlGaN) may be disposed between the bottom contact layer 820 and the MQW layer 825. The MQW layer 825 may be doped with the same doping polarity as the bottom contact layer 820, e.g., n-type doped. The MQW layer 825 may include, consist essentially of, or consist of one or more quantum wells separated by (or surrounded on both sides by) barriers. For example, each period of MQW layer 825 may feature an $Al_xGa_{1-x}N$ quantum well and an $Al_yGa_{1-y}N$ barrier, where x is different from y. Typically, y is greater than 0.4 for light-emitting devices designed to emit light having a wavelength less than 300 nm and may be greater than 0.7 for shorter-wavelength emitters. It may even be greater than 0.9 for devices designed to emit at wavelengths shorter than 250 nm. The value of x will, at least in part, determine the emission wavelength of the device. For emission wavelengths longer than 280 nm, x may be as low as 0.2. For wavelengths between 250 nm and 280 nm, x may vary between 0.2 and 0.7. For wavelengths shorter than 250 nm, x may be greater than 0.6. In various embodiments, the difference between x and y is large enough to obtain good confinement of the electrons and holes in the active region, thus enabling high ratio of radiative recombination to non-radiative recombination. In an embodiment, the difference between x and y is approximately 0.25, e.g., x is approximately 0.5 and y is approximately 0.75. MQW layer 825 may include a plurality of such periods, and may have a total thickness ranging from 20 nm to 100 nm, or less than approximately 50 nm. In various embodiments of the invention, the active light-emitting structure 815 is configured to (e.g., has a MQW layer 825 having layer composition(s) selected to) emit ultraviolet light.

In various embodiments of the invention, an electron-blocking layer 830 may be disposed over MQW layer 825. The electron-blocking layer 830 typically has a wider band gap than that of a band gap within the MQW layer 825 (e.g., a band gap of the barrier layers therewithin). In various embodiments, the electron-blocking layer 830 may include, consist essentially of, or consist of e.g., $Al_xGa_{1-x}N$, and electron-blocking layer 830 may be doped. For example, the electron-blocking layer 830 may be doped with the same doping polarity as that of bottom contact layer 820 and/or MQW layer 825 (e.g., n-type doped). In various embodiments, the value of x in the electron-blocking layer 830 is greater than the value of the Al mole fraction in the barrier layers used in the MQW layer 825. For longer wavelength devices with emission wavelengths greater than 300 nm, x may be as low as 0.4 and may be greater than 0.7 for shorter wavelength devices. It may even be greater than 0.9 for devices designed to emit at wavelengths shorter than 250 nm. Electron-blocking layer 830 may have a thickness that may range, for example, between approximately 10 nm and approximately 50 nm, or even between approximately 10 nm and approximately 30 nm. In various embodiments of the invention, the electron-blocking layer 830 is sufficiently thin (e.g., thickness less than about 30 nm, or less than about 20 nm) so as to facilitate carrier (e.g., hole) tunneling through the electron-blocking layer 830. In various embodiments of the invention, the electron-blocking layer 830 is omitted from device structure 800.

As shown in FIG. 8A, device structure 800 may also include a graded layer 835 disposed above the electron-blocking layer 830 (or above the MQW layer 825 in embodiments in which electron-blocking layer 830 is omitted), and a cap layer (or "top contact layer") 840 may be disposed over the graded layer 835. The cap layer 840 may be doped with a doping polarity opposite of that of the bottom contact layer 820, e.g., p-type doped with one or more dopants such as Mg, Be, and/or Zn. In other embodiments, the cap layer 840 may be undoped, as carriers (e.g., holes) may be injected from an electrode into a two-dimensional carrier gas disposed at the interface between the cap layer 840 and the graded layer 835. (While in exemplary embodiments described herein the cap layer 840 is doped p-type and the bottom contact layer 820 is doped n-type, embodiments in which the doping polarities of these layers are switched are within the scope of the present invention; in such embodiments, the electron-blocking layer 830, if present, may be considered to be a "hole-blocking layer," as understood by those of skill in the art.) The cap layer 840 may have a thickness ranging from, e.g., approximately 1 nm to approximately 100 nm, or approximately 1 nm to approximately 50 nm, or approximately 1 nm to approximately 20 nm. In various embodiments, the cap layer 840 includes, consists essentially of, or consists of $Al_xGa_{1-x}N$, and in various embodiments the aluminum concentration x may range from 0 (i.e., pure GaN) to approximately 0.2.

The device structure 800 may also incorporate one or more metallic contacts to facilitate electrical contact to the device. For example, one metallic contact may include or consist essentially of an electrode layer 845 disposed above or on the cap layer 840. The composition and/or shape of the electrode layer 845 are not particularly limited as long as it enables the injection of carriers (e.g., holes) into the cap layer 840. In embodiments in which holes are injected into a p-type doped nitride-based semiconductor cap layer 840, the electrode layer 845 may include, consist essentially of, or consist of one or more metals having large work functions, e.g., Ni, Au, Pt, Ag, Rh, and/or Pd, alloys or mixtures of two or more of these metals, or oxide-based and/or transparent electrode materials such as indium tin oxide (ITO). In embodiments in which electrons are injected into an n-type doped nitride-based semiconductor cap layer 840, the electrode layer 845 may include, consist essentially of, or consist of one or more metals, e.g., Ti, Al, Au, Pt, Ni, and/or V, alloys or mixtures of two or more of these metals, or oxide-based and/or transparent electrode materials such as indium tin oxide (ITO). Electrode layers 845 in accordance with embodiments of the invention are not limited to these materials. The thickness of the electrode layer 845 may be, for example, between approximately 10 nm and approximately 100 nm, or between approximately 10 nm and approximately 50 nm, or between approximately 10 nm and approximately 30 nm, or between approximately 25 nm and approximately 40 nm. In various embodiments, the electrode layer 845 is formed after removal of all or a portion of the substrate 805.

Figure 8B:
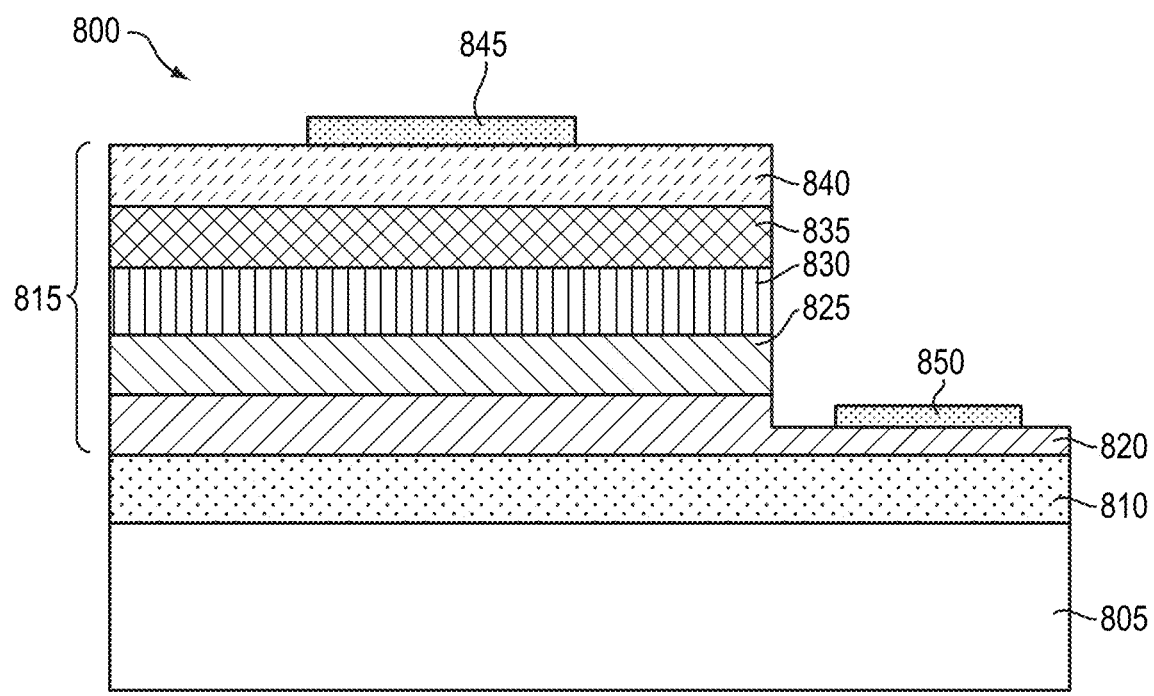

In various embodiments, a second electrode layer 850 may be formed in electrical contact with (and, in various embodiments, direct mechanical contact with) the bottom contact layer 820, even if the substrate 805 is not removed, as shown in FIG. 8B; such an electrode layer 850 may be considered to be a "bottom electrode layer." For example, a portion of the active structure 815 may be removed by, e.g., conventional photolithography and wet and/or dry etching, in order to reveal at least a portion of the bottom contact layer 820. The second electrode layer 850 may then be deposited on the bottom contact layer. The composition and/or shape of the bottom electrode layer 850 are not particularly limited as long as it enables the injection of carriers (e.g., electrons) into the bottom contact layer 820. In embodiments in which electrons are injected into an n-type doped nitride-based semiconductor bottom contact layer 820, the bottom electrode layer 850 may include, consist essentially of, or consist of one or more metals such as one or more metals, e.g., Ti, Al, Au, Pt, Ni, and/or V, alloys or mixtures of two or more of these metals, or oxide-based and/or transparent electrode materials such as indium tin oxide (ITO). In embodiments in which holes are injected into a p-type doped nitride-based semiconductor bottom contact layer 820, the bottom electrode layer 850 may include, consist essentially of, or consist of one or more metals having large work functions, e.g., Ni, Au, Pt, Ag, Rh, and/or Pd, alloys or mixtures of two or more of these metals, or oxide-based and/or transparent electrode materials such as indium tin oxide (ITO). Bottom electrode layers 850 in accordance with embodiments of the invention are not limited to these materials. The thickness of the bottom electrode layer 850 may be, for example, between approximately 10 nm and approximately 100 nm, or between approximately 10 nm and approximately 50 nm, or between approximately 10 nm and approximately 30 nm, or between approximately 25 nm and approximately 40 nm.

As mentioned above, embodiments of the present invention feature a graded layer 835 disposed between the cap layer 840 and the electron-blocking layer 830 (or the MQW layer 815 in embodiments in which the electron-blocking layer 830 is omitted). The graded layer 835 typically includes, consists essentially of, or consists of a nitride semiconductor, e.g., a mixture or alloy of Ga, In, and/or Al with N. The compositional gradient within graded layer 835 may be substantially continuous or stepped, and the grading rate within the graded layer 835 may be substantially constant or may change one or more times within the thickness of graded layer 835. The graded layer 835 may be undoped. In other embodiments, the graded layer 835 is doped n-type or p-type with one or more dopants, e.g., C, H, F, O, Mg, Be, Zn, and/or Si. The thickness of the graded layer 835 may be, for example, between approximately 5 nm and approximately 100 nm, between approximately 10 nm and approximately 50 nm, or between approximately 20 nm and approximately 40 nm. In various embodiments, the epitaxial growth process utilized to form the various layers of the device structure 800 may be temporarily halted between growth of the graded layer 835 and the underlying layer and/or the overlying layer. In various embodiments, the graded layer 835 is pseudomorphically strained to one or more of the underlying layers and/or to the substrate 805.

In various embodiments of the invention, one or more (or even all) of the layers of device structure 800 formed over substrate 805 may be pseudomorphically strained, similar to device layers described in U.S. Pat. No. 9,437,430, filed on Jan. 25, 2008, U.S. Pat. No. 8,080,833, filed on Apr. 21, 2010, and U.S. Pat. No. 9,299,880, filed on Mar. 13, 2014, the entire disclosure of each of which is incorporated by reference herein. Thus, as detailed therein, in various embodiments, one or more of the layers of device structure 800 may be pseudomorphic and may have a thickness greater than its predicted (e.g., via the Maxwell-Blakeslee theory) critical thickness. Moreover, the collective layer structure of device structure 800 may have a total thickness greater than the predicted critical thickness for the layers considered collectively (i.e., for a multiple-layer structure, the entire structure has a predicted critical thickness even when each individual layer would be less than a predicted critical thickness thereof considered in isolation). In other embodiments, one or more layers of device structure 800 are pseudomorphically strained and cap layer 840 is partially or substantially fully relaxed. For example, the lattice mismatch between cap layer 840 and substrate 805 and/or MQW layer 835 may be greater than approximately 1%, greater than approximately 2%, or even greater than approximately 3%. In an exemplary embodiment, cap layer 840 includes, consists essentially of, or consists of undoped or doped GaN, substrate 805 includes, consists essentially of, or consists of doped or undoped single-crystalline AlN, and MQW layer 825 includes, consists essentially of, or consists of multiple $Al_{0.55}Ga_{0.45}N$ quantum wells interleaved with $Al_{0.75}Ga_{0.25}N$ barrier layers, and cap layer 840 is lattice mismatched by approximately 2.4%. Cap layer 840 may be substantially relaxed, i.e., may have a lattice parameter approximately equal to its theoretical unstrained lattice constant. A partially or substantially relaxed cap layer 840 may contain strain-relieving dislocations having segments threading to the surface of cap layer 840 (such dislocations may be termed "threading dislocations"). The threading dislocation density of a relaxed cap layer 840 may be larger than that of substrate 805 and/or layers underlying cap layer 840 by, e.g., one, two, or three orders of magnitude, or even more.

In accordance with embodiments of the present invention, application of light (e.g., laser light) and/or heat may be utilized to separate all or a portion of the substrate 805 from the rest of device structure 800, as detailed in the '031 patent application. Before such substrate separation, the device structure 800 may be attached to a handle wafer (not shown) by, for example, wafer bonding or an adhesive material. In various embodiments, the device structure 800 may be wafer bonded to the handle wafer via use of an intermediate material such as, for example, photoresist (e.g., SU-8), glass frit, an organic material such as benzocyclobutene (BCB), etc. Wafer bonding techniques, including reversible ones (i.e., techniques in which the handle wafer is straightforwardly removed after bonding and processing) are known to those of skill in the art and may be accomplished without undue experimentation. The handle wafer may be at least substantially transparent to light emitted by the active structure 815 and/or to light utilized to separate substrate 805 (e.g., via absorption within release layer 810). The handle wafer may include, consist essentially of, or consist of, for example, one or more semiconductor materials, sapphire, quartz, etc. For substrate separation, heat and/or light having a wavelength corresponding to an absorption band within release layer 810 (e.g., approximately 310 nm for oxygen-doped AlN) may be emitted into the device structure 800 (e.g., from below the substrate 805 and/or from one or more sides of the bonded structure). (As utilized herein, a wavelength "corresponding to" an absorption band is sufficiently close to the absorption band such that an amount of the light sufficient to effect at least partial release of an underlying substrate and/or layer is absorbable within the layer having the absorption band.) In various embodiments, the light is primarily composed of or contains a wavelength that is within ±20 nm, within ±10 nm, within ±5 nm, within ±2 nm, or within ±1 nm of the wavelength of an absorption band within the release layer 810. In various embodiments, the release layer 810 may have more than one absorption band (due to, e.g., introduction of two or more different dopants), and the light may be primarily composed of or contain one or more wavelengths that are within ±20 nm, within ±10 nm, within ±5 nm, within ±2 nm, or within ±1 nm of the wavelength of one or more of the absorption bands within the release layer 810. Absorption of the light and/or heat within the release layer 810 results in local heating within the release layer 810, which may be magnified for release layers 810 having lower thermal conductivity. The local heating results in crack formation and subsequent fracture within the release layer 810 and/or at the interface between release layer 810 and substrate 805, thereby removing the substrate 805 (or at least a portion thereof) from device structure 800. In various embodiments of the invention, the light may be applied at a fluence ranging from, for example, approximately 500 $mJ/cm^2$ to approximately 1000 $mJ/cm^2$. In various embodiments of the invention, the light may be applied as one or more pulses. Such pulses may have durations ranging from, for example, approximately 10 ms to approximately 100 ms.

In various embodiments, at least a portion of the release layer 810 remains attached to the device structure 800 upon removal of the substrate 805. After removal of the substrate 805, any remaining portion of the release layer 810 may be removed (e.g., by selective etching or grinding and/or polishing). A metallic contact may be formed in contact with the bottom contact layer 820, and the device structure 800 may be utilized to emit light without absorption thereof by substrate 805. The metallic contact may be formed on the "bottom" surface of the bottom contact layer 820 (i.e., the surface of the bottom contact layer 820 opposite the top contact layer), or a portion of the structure may be etched away so that the metallic contact may be formed on a thusly revealed "top" surface of the bottom contact layer (i.e., the surface of the bottom contact layer 820 opposite the prior location of substrate 805). In various embodiments, any handle wafer used in the substrate-separation process is removed from the device structure 800, while in other embodiments, the handle wafer remains attached to the device structure 800.

Figure 9A:
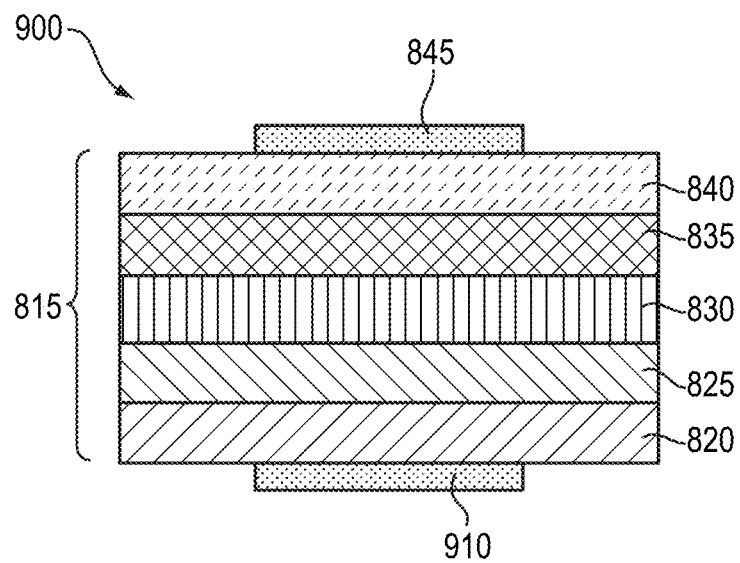
FIGS. 9A and 9B are schematic cross-sections of light-emitting devices after substrate removal in accordance with various embodiments of the invention.
Figure 9B:
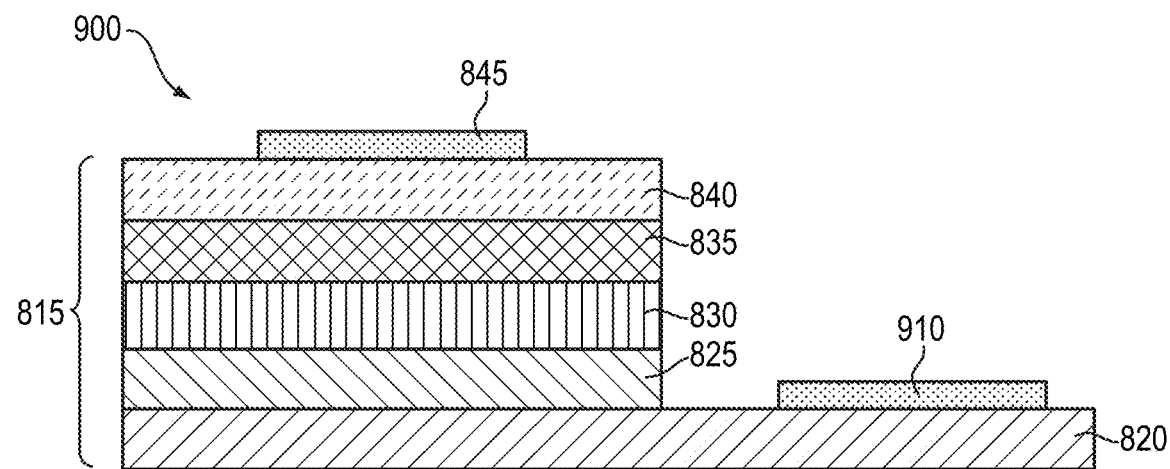

As mentioned, after removal of all or a portion of the substrate 805, electrical contacts may be made to the bottom contact layer 820 and the cap layer 840 so that power may be applied to the device structure 800, resulting in light emission therefrom. FIGS. 9A and 9B depict different device structures 900 in accordance with various embodiments, in which a bottom electrode layer 910 is formed below the newly exposed bottom contact layer 820 after removal of the substrate 805 (FIG. 9A) and on top of a portion of bottom contact layer 820 after removal of the substrate 805 and masking and removal of a portion of the active structure 815 (FIG. 9B). The composition and/or shape of the bottom electrode layer 910 are not particularly limited as long as it enables the injection of carriers (e.g., electrons) into the bottom contact layer 820. In embodiments in which electrons are injected into an n-type doped nitride-based semiconductor bottom contact layer 820, the bottom electrode layer 910 may include, consist essentially of, or consist of one or more metals such as one or more metals, e.g., Ti, Al, Au, Pt, Ni, and/or V, alloys or mixtures of two or more of these metals, or oxide-based and/or transparent electrode materials such as indium tin oxide (ITO). In embodiments in which holes are injected into a p-type doped nitride-based semiconductor bottom contact layer 820, the bottom electrode layer 910 may include, consist essentially of, or consist of one or more metals having large work functions, e.g., Ni, Au, Pt, Ag, Rh, and/or Pd, alloys or mixtures of two or more of these metals, or oxide-based and/or transparent electrode materials such as indium tin oxide (ITO). Bottom electrode layers 910 in accordance with embodiments of the invention are not limited to these materials. The thickness of the bottom electrode layer 910 may be, for example, between approximately 10 nm and approximately 100 nm, or between approximately 10 nm and approximately 50 nm, or between approximately 10 nm and approximately 30 nm, or between approximately 25 nm and approximately 40 nm.

After formation of the electrodes 845 and/or 910, the resulting light-emitting device may be electrically connected to a package, for example as detailed in U.S. Pat. No. 9,293,670, filed on Apr. 6, 2015 (the '670 patent), the entire disclosure of which is incorporated by reference herein. A lens may also be positioned on the device to transmit (and, in various embodiments, shape) the light emitted by the device. For example, a rigid lens may be disposed over the device as described in the '670 patent or in U.S. Pat. No. 8,962,359, filed on Jul. 19, 2012, or in U.S. Pat. No. 9,935,247, filed on Jul. 23, 2015, the entire disclosure of each of which is incorporated by reference herein. After packaging, any handle wafer remaining on the active structure 815 may be removed.

In accordance with embodiments of the invention, other techniques for partial or complete substrate removal may be utilized. For example, etching techniques, such as electrochemical etching techniques described in U.S. patent application Ser. No. 16/161,320, filed on Oct. 16, 2018, the entire disclosure of which is incorporated by reference herein, may be utilized.

The growth of bulk single crystals has been described herein primarily as being implemented by what is commonly referred to as a "sublimation" or "sublimation-recondensation" technique wherein the source vapor is produced at least in part when, for production of AlN, crystalline solids of AlN or other solids or liquids containing AlN, Al or N sublime preferentially. However, the source vapor may be achieved in whole or in part by the injection of source gases or the like techniques that some would refer to as "high-temperature CVD." Also, other terms are sometimes used to describe these and techniques that are used to grow bulk single AlN crystals in accordance with embodiments of the invention. Therefore, the terms "depositing," "growing," "depositing vapor species," and like terms are used herein to generally cover those techniques by which the crystal may be grown pursuant to embodiments of this invention.

The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. A method of improving ultraviolet (UV) transparency of a single-crystal AlN bulk crystal, the method comprising:
   heating the AlN bulk crystal to an annealing temperature of at least 2000° C.;
   thereafter, cooling the AlN bulk crystal via a cooling cycle comprising:
      (i) cooling the AlN bulk crystal from the annealing temperature to a first temperature ranging from 1450° C. to 2150° C. over a first time ranging from 10 minutes to 90 minutes, and (ii) thereafter, cooling the AlN bulk crystal from the first temperature to a second temperature ranging from 1000° C. to 1650° C. over a second time ranging from 10 seconds to 10 minutes, or
      (i) cooling the AlN bulk crystal from the annealing temperature to a third temperature ranging from 1450° C. to 2150° C. over a third time ranging from 10 seconds to 10 minutes, and (ii) thereafter, cooling the AlN bulk crystal from the third temperature to a fourth temperature ranging from 1000° C. to 1650° C. over a fourth time ranging from 10 minutes to 90 minutes; and
   thereafter, cooling the AlN bulk crystal to approximately room temperature.

2. The method of claim 1, further comprising, after heating the AlN bulk crystal to the annealing temperature and before cooling the AlN bulk crystal via the cooling cycle, maintaining the AlN bulk crystal at the annealing temperature for a soak time ranging from 1 hour to 10 hours.

3. The method of claim 1, wherein a diameter of the AlN bulk crystal is approximately 50 mm or larger.

4. The method of claim 1, wherein a diameter of the AlN bulk crystal is approximately 50 mm.

5. The method of claim 1, further comprising fabricating a light-emitting device over at least a portion of the AlN bulk crystal.

6. The method of claim 5, wherein the light-emitting device is configured to emit ultraviolet light.

7. The method of claim 5, further comprising, after forming at least a portion of the light-emitting device, removing at least a portion of the AlN bulk crystal from the light-emitting device.

8. The method of claim 5, wherein the light-emitting device comprises a light-emitting diode or a laser.

9. A method of improving ultraviolet (UV) transparency of a single-crystal AlN bulk crystal, the method comprising:
   forming the AlN bulk crystal via vapor-phase growth within a crystal-growth apparatus;
   removing the AlN bulk crystal from the crystal-growth apparatus;
   within an annealing apparatus different from the crystal-growth apparatus, heating the AlN bulk crystal to an annealing temperature of at least 2000° C.;
   thereafter, cooling the AlN bulk crystal via a cooling cycle comprising:
      cooling the AlN bulk crystal from the annealing temperature to a first temperature ranging from 1000° C. to 1650° C. over a time period ranging from 1 hour to 10 hours; and
      thereafter, cooling the AlN bulk crystal to approximately room temperature.

10. The method of claim 9, further comprising, after heating the AlN bulk crystal to the annealing temperature and before cooling the AlN bulk crystal via the cooling cycle, maintaining the AlN bulk crystal at the annealing temperature for a soak time ranging from 1 hour to 10 hours.

11. The method of claim 9, wherein a diameter of the AlN bulk crystal is approximately 50 mm or larger.

12. The method of claim 9, wherein a diameter of the AlN bulk crystal is approximately 50 mm.

13. The method of claim 9, further comprising fabricating a light-emitting device over at least a portion of the AlN bulk crystal.

14. The method of claim 13, wherein the light-emitting device is configured to emit ultraviolet light.

15. The method of claim 13, further comprising, after forming at least a portion of the light-emitting device, removing at least a portion of the AlN bulk crystal from the light-emitting device.

16. The method of claim 13, wherein the light-emitting device comprises a light-emitting diode or a laser.

17. A method of forming a polycrystalline AlN source, the method comprising:
   providing a bulk polycrystalline AlN ceramic;
   disposing at least a portion of the AlN ceramic into a crucible;

annealing and densifying the at least a portion of the AlN ceramic in the crucible, thereby forming a polycrystalline AlN source, the annealing and densifying comprising:
- (i) heating the at least a portion of the AlN ceramic at a first temperature ranging from 1100° C. to 1900° C. for a first time ranging from 2 hours to 25 hours, and (ii) thereafter, heating the at least a portion of the AlN ceramic at a second temperature ranging from 1900° C. to 2250° C. for a second time ranging from 3 hours to 15 hours, or
- (i) heating the at least a portion of the AlN ceramic during a temperature ramp to a third temperature ranging from 1900° C. to 2250° C. over a third time ranging from 5 hours to 25 hours, and (ii) thereafter, heating the at least a portion of the AlN ceramic at a fourth temperature ranging from 1900° C. to 2250° C. for a fourth time ranging from 3 hours to 25 hours; and cooling the AlN source to approximately room temperature.

18. The method of claim 17, further comprising, prior to disposing the at least a portion of the AlN ceramic into the crucible, fragmenting the AlN ceramic into fragments each having a width greater than approximately 0.5 cm and less than approximately 2 cm, whereby the at least a portion of the AlN ceramic comprises at least some of the fragments.

19. The method of claim 17, wherein the bulk polycrystalline AlN ceramic has less than approximately 1% excess Al.

20. The method of claim 17, wherein the bulk polycrystalline AlN ceramic has an oxygen concentration less than $2 \times 10^{19}$ cm$^{-3}$.

21. The method of claim 9, wherein forming the AlN bulk crystal comprises (i) forming an AlN boule via vapor-phase growth, the AlN boule being larger than the AlN bulk crystal, and (ii) separating the AlN bulk crystal from the AlN boule prior to heating the AlN bulk crystal to the annealing temperature.

22. The method of claim 9, wherein the AlN bulk crystal is heated within an oxygen-containing ambient.

23. The method of claim 22, wherein, after the AlN bulk crystal is cooled to approximately room temperature, a ratio of carbon to oxygen concentration in the AlN bulk crystal is less than 0.5.

24. The method of claim 9, further comprising cooling the AlN bulk crystal from a growth temperature without controlling a cooling rate thereof before removing the AlN bulk crystal from the crystal-growth apparatus.

* * * * *